(12) United States Patent
Tokii et al.

(10) Patent No.: US 9,955,604 B2
(45) Date of Patent: Apr. 24, 2018

(54) MOUNTING STRUCTURE AND METHOD FOR SUPPLYING REINFORCING RESIN MATERIAL

(71) Applicant: Panasonic Intellectual Property Management Co., Ltd., Osaka-shi, Osaka (JP)

(72) Inventors: Seiji Tokii, Osaka (JP); Manabu Tasaki, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 298 days.

(21) Appl. No.: 14/640,873

(22) Filed: Mar. 6, 2015

(65) Prior Publication Data

US 2015/0181740 A1 Jun. 25, 2015

Related U.S. Application Data

(63) Continuation of application No. PCT/JP2012/005641, filed on Sep. 6, 2012.

(51) Int. Cl.
*H05K 1/18* (2006.01)
*H05K 7/02* (2006.01)
(Continued)

(52) U.S. Cl.
CPC ............. *H05K 7/02* (2013.01); *H05K 3/301* (2013.01); *H05K 13/04* (2013.01); *H05K 1/162* (2013.01);
(Continued)

(58) Field of Classification Search
CPC ................. H05K 1/181; H05K 1/182; H05K 2201/10159; H05K 2201/10674;
(Continued)

(56) References Cited

U.S. PATENT DOCUMENTS 5,864,642 A * 1/1999 Chun .................... H05K 1/0274
385/14
5,866,953 A * 2/1999 Akram .................. H01L 21/563
257/687

(Continued)

FOREIGN PATENT DOCUMENTS

CN 1582087 A 2/2005
JP 08-316616 11/1996
(Continued)

OTHER PUBLICATIONS

Chinese Office Action, dated Oct. 9, 2016, Chinese Patent Application No. 201280075640.8 with English translation of earch report (7 pages).

(Continued)

*Primary Examiner* — Binh Tran
(74) *Attorney, Agent, or Firm* — Hamre, Schumann, Mueller & Larson, P.C.

(57) ABSTRACT

A mounting structure for an electronic component and a method for mounting the electronic component are provided with a sufficient reinforcing effect for the relatively tall electronic component raised from a substrate. The mounting structure and the mounting method can easily respond to a change of the shape of the electronic component. In a mounting structure 1, a substrate 2 and an electronic component 4 raised on the substrate 2 are joined with bonding metal 3 and a reinforcing resin body 5 is bonded to the substrate 2 and the electronic component 4. The reinforcing resin body 5 includes a plurality of reinforcing resin layers 5a. The reinforcing resin layers 5a constituting the reinforcing resin body 5 are stacked in the height direction of the raised electronic component 4 along a side 4a of the electronic component 4 so as to be raised from the substrate 2.

10 Claims, 28 Drawing Sheets

(51) Int. Cl.
*H05K 3/30* (2006.01)
*H05K 13/04* (2006.01)
*H05K 7/00* (2006.01)
*H05K 1/16* (2006.01)
*H05K 3/28* (2006.01)
*H05K 3/34* (2006.01)

(52) U.S. Cl.
CPC .............. *H05K 1/165* (2013.01); *H05K 1/167* (2013.01); *H05K 1/181* (2013.01); *H05K 1/182* (2013.01); *H05K 3/284* (2013.01); *H05K 3/3447* (2013.01); *H05K 2201/10007* (2013.01); *H05K 2201/10159* (2013.01); *H05K 2201/10583* (2013.01); *H05K 2201/10674* (2013.01)

(58) Field of Classification Search
CPC ........ H05K 1/162; H05K 1/165; H05K 1/167; H05K 2201/10007; H05K 2201/10015; H05K 2201/10022; H05K 2201/1003; H05K 2201/0129; H01L 2924/18161; H01L 2021/60277; H01L 2224/40491; H01L 2224/8085; H01L 2224/8185; H01L 2224/8285; H01L 2224/8385; H01L 2224/8485; H01L 2224/8585; H01L 2224/8685
USPC ....... 361/760, 763, 764, 768, 777, 782, 783; 174/257, 258, 259; 438/107–109
See application file for complete search history.

(56) References Cited

U.S. PATENT DOCUMENTS

| | | | |
|---|---|---|---|
| 6,566,669 | B2 | 5/2003 | Watanabe |
| 6,583,402 | B1 | 6/2003 | Watanabe |
| 2002/0020811 | A1 | 2/2002 | Watanabe |
| 2002/0024025 | A1 | 2/2002 | Watanabe |
| 2010/0132991 | A1 | 6/2010 | Takizawa et al. |
| 2011/0108997 | A1* | 5/2011 | Ohashi .................. H05K 3/305 257/782 |
| 2011/0315321 | A1* | 12/2011 | Yoshinaga ............ H01L 21/561 156/356 |

FOREIGN PATENT DOCUMENTS

| | | |
|---|---|---|
| JP | 10-233566 | 9/1998 |
| JP | 2000-286303 | 10/2000 |
| JP | 2001-102237 | 4/2001 |
| JP | 2001-135920 | 5/2001 |
| JP | 2005-064159 | 3/2005 |
| JP | 2010-129902 | 6/2010 |
| TW | 407451 B | 10/2001 |

OTHER PUBLICATIONS

International Search Report dated Dec. 4, 2012; PCT/JP2012/005641 (2 pages).

\* cited by examiner

US 9,955,604 B2

MOUNTING STRUCTURE AND METHOD FOR SUPPLYING REINFORCING RESIN MATERIAL

FIELD OF THE INVENTION

The present invention relates to a mounting structure including an electronic component mounted on a substrate, and a method for supplying a reinforcing resin material disposed in the mounting structure.

BACKGROUND OF THE INVENTION

Conventionally, electronic components have been joined and mounted onto a substrate, e.g., a printed circuit board with bonding metal such as solder in widespread application. However, if a large external force is likely to be applied to an electronic component, only a solder joint on the electronic component may not have sufficient bonding strength.

As shown in FIGS. 28 and 29, a solution to this problem is to apply reinforcing resin 54 along the side of an electronic component 52 that is not only bonded to a substrate 53 with solder (solder balls in FIG. 28) 51, but also allows the reinforcing resin 54 to bond the electronic component 52 onto the substrate 53 with reinforced holding power at a joint (for example, Japanese Patent Laid-Open No. 2010-129902). In the reinforcing structure, the reinforcing resin 54 is applied to the corners of the electronic component 52, e.g., a BGA that has a low profile from the substrate 53 with a flat and rectangular shape. The reinforcing structure can satisfactorily reinforce the corners of the electronic component 52 where stress concentration is likely to occur relative to an external force, achieving a remarkably improved reinforcing effect. Advantageously, the reinforcing structure can easily respond to a change of the shape or size of the electronic component 52 only by changing the position of application of the reinforcing resin 54.

Although this reinforcing method is effective for the low-profile electronic component 52, e.g., a BGA, if the method is applied to a large electronic component 56, e.g., a large capacitor or transformer that is relatively thick in profile from the substrate 53 and is relatively heavy as shown in FIGS. 30A to 30C, for example, large vibrations a may concentrate a stress b at a joint 55 between the reinforcing resin 54 and the substrate 53, resulting in an insufficient reinforcing effect. In other words, in the case of the large electronic component 56, the reinforcing resin 54 is vertically applied along a side 56a of the electronic component 56 (for example, from a point on the substrate 53 to the upper part of the side of the electronic component 56). This may concentrate the stress b at the joint 55 between the reinforcing resin 54 and the substrate 53, at the bottom of the reinforcing resin 54, thereby separating the reinforcing resin 54 from the substrate 53 so as to deteriorate the reinforcing function.

For such a large electronic component, in a proposed structure as shown in FIG. 31, a reinforcing component 61 shaped along the outside shape of the lower part of an electronic component 60 is fit onto the electronic component 60 from below and elastic protrusions 62 elastically in contact with the outer surface of the electronic component 60 are formed on the inner periphery of the reinforcing component 61 (for example, Japanese Patent Laid-Open No. 2001-102237). In this structure, however, the reinforcing component 61 needs to be fabricated again according to a size change of the electronic component 60, increasing the manufacturing cost and the number of manufacturing steps.

In another proposed method, a tying band for fixing an electronic component is used, a hole for insertion of the tying band is formed on a substrate, and the tying band is inserted into the hole so as to restrain the substrate and the electronic component, mechanically fixing the electronic component to the substrate (for example, Japanese Patent Laid-Open No. 10-233566). In this case, however, the hole for fixing the tying band needs to be formed on the substrate. This further limits the design with restricted applicability.

As has been discussed, in the mounting structure shown in FIGS. 30A to 30C, the reinforcing resin 54 is vertically applied along the side 56a of the electronic component 56 (that is, in the height direction of the electronic component 56) so as to reinforce the joint holding power of the electronic component 52 on the substrate 53. Advantageously, the mounting structure can easily respond to a change of the shape of the electronic component 56 only by changing the position of application of the reinforcing resin 54, whereas the mounting structure cannot obtain a sufficient reinforcing effect for the relatively large electronic component 56 joined to the substrate 53.

In the method using the structure and tying band of FIG. 31, a sufficient reinforcing effect can be obtained for the large electronic component 60 joined to the substrate. However, this method may increase the manufacturing cost and the number of manufacturing steps, further limiting the design with restricted applicability.

As has been discussed, the conventional mounting structure and method for an electronic component cannot simultaneously achieve the function of obtaining a sufficient reinforcing effect for a relatively large electronic component and the function of easily responding to a change of the shape of the electronic component.

The present invention has been devised to solve the problem. An object of the present invention is to provide a mounting structure and a method for supplying a reinforcing resin material, which can obtain a sufficient reinforcing effect for an electronic component, e.g., a large capacitor that is relatively thick in profile from a substrate, and easily respond to a change of the shape of the electronic component.

DISCLOSURE OF THE INVENTION

In order to solve the problem, the present invention is a mounting structure including a substrate; an electronic component mounted on the substrate so as to be raised on the substrate joined to the electronic component with bonding metal; and at least one reinforcing resin body bonded to the substrate and the electronic component, the at least one reinforcing resin body including a plurality of reinforcing resin layers, the at least one reinforcing resin body being configured such that the reinforcing resin layers are stacked in the height direction of the raised electronic component so as to be raised from the substrate along the side of the electronic component.

With this configuration, the reinforcing resin body includes the multiple reinforcing resin layers that are stacked in the height direction of the raised electronic component. Thus, even if the electronic component is a large capacitor or transformer that is relatively thick in profile from the substrate and is relatively heavy and large vibrations or the like are applied to the mounting structure, for example, a stress caused by the vibrations is spread and absorbed in a part where the reinforcing resin layers are vertically stacked in contact with each other, thereby satisfactorily keeping the reinforcing function.

Moreover, the at least one reinforcing resin body includes a plurality of reinforcing resin bodies spaced at certain intervals in the circumferential direction of the electronic component. This configuration requires a smaller amount of a reinforcing resin material that is the material of the reinforcing resin body, as compared with the reinforcing resin body covering the whole circumference of the electronic component.

Furthermore, the reinforcing resin layers of the reinforcing resin body are stacked in the height direction of the electronic component while being extended in the width direction of the side of the electronic component. With this configuration, the reinforcing resin layers of each of the reinforcing resin body can satisfactorily hold the electronic component in the circumferential direction.

Moreover, in the reinforcing resin body, the second reinforcing resin layer from the bottom in the height direction of the electronic component has at least a quarter of the volume of the bottom reinforcing resin layer in contact with the substrate. With this configuration, for example, a stress caused by vibrations can be satisfactorily absorbed in the contact portion of the reinforcing resin layers adjacent to each other in the vertical direction. Specifically, if the second reinforcing resin layer from the bottom in the height direction of the electronic component has a volume smaller than a quarter of the volume of the bottom reinforcing resin layer in contact with the substrate, vibrations may be caused at least by the second and higher reinforcing resin layers from the bottom in the height direction of the electronic component or, for example, a stress caused by vibrations may not be satisfactorily absorbed by the contact portion between the reinforcing resin layers. The configuration of the present invention can prevent such a problem.

Furthermore, the reinforcing resin layers adjacent to each other in the height direction of the electronic component may have separated end faces. With this configuration, a stress or the like caused by vibrations is spread and absorbed in a portion where the reinforcing resin layers vertically adjacent to each other are stacked in contact with each other in the vertical direction. This can satisfactorily keep the reinforcing function.

Moreover, the reinforcing resin layer may have one end that is extended in the width direction of the side of the electronic component and then is folded toward the opposite side in the width direction so as to continue to one end of another reinforcing resin layer adjacent to the reinforcing resin layer in the height direction of the electronic component.

With this configuration, the reinforcing resin layers vertically adjacent to each other are stacked on top of each other in the vertical direction with the ends folded in a continuous manner. This connecting portion also elastically absorbs, for example, a stress caused by vibrations, thereby more satisfactorily keeping the reinforcing function.

Furthermore, the reinforcing resin layers of the reinforcing resin body decrease in dimension in the width direction of the side of the electronic component as the height from the substrate increases. This configuration can reinforce the electronic component with the reinforcing resin body having a small volume unlike in the case where the bottom reinforcing resin layer in contact with the substrate and the upper reinforcing resin layers are identical in dimension in the width direction of the side of the electronic component. Thus, the manufacturing cost and the weight of the mounting structure can be reduced. Moreover, the reinforcing resin layers increase in dimension with a decrease in height from the substrate and an increase in stress in the width direction of the side of the electronic component (that is, the bottom layer). Thus, the bottom of the reinforcing resin body is extended so as to satisfactorily reinforce the electronic component in a stable state.

Moreover, the reinforcing resin layers of the reinforcing resin body decrease in thickness along the side of the electronic component as the height from the substrate increases. This configuration can reinforce the electronic component with the reinforcing resin body having a small volume unlike in the case where the bottom reinforcing resin layer and the upper reinforcing resin layers are identical in thickness. Thus, the manufacturing cost and the weight of the mounting structure can be reduced. Since the reinforcing resin layers increase in thickness with a decrease in height from the substrate and an increase in stress along the side of the electronic component (that is, the bottom layer), the bottom of the reinforcing resin body is extended so as to satisfactorily reinforce the electronic component in a stable state.

Furthermore, the reinforcing resin body covers at least a part of the top surface of the electronic component. With this configuration, the reinforcing resin body covers the top surface of the electronic component as well as the side of the electronic component, thereby increasing the reinforcing force of the reinforcing resin body.

Moreover, the electronic component to be reinforced is preferably an insertion electronic component that includes a connecting terminal inserted into a through hole formed on the substrate and is joined and mounted on the circuit of the substrate with the bonding metal.

A method for supplying a reinforcing resin material that is the material of a reinforcing resin body according to the present invention, to a substrate and an the electronic component joined and mounted on the substrate with bonding metal so as to be raised on the substrate, the method including the step of supplying the reinforcing resin material along the side of the electronic component mounted on the substrate and stacking the reinforcing resin material in the height direction (rising direction) of the electronic component. The supplying method can satisfactorily form the reinforcing resin material.

Moreover, the reinforcing resin material is supplied from a resin supply unit widely in the width direction of the side of the electronic component along the side of the electronic component; meanwhile, the reinforcing resin material is stacked by sequentially moving the resin supply unit from a bottom layer in the height direction of the electronic component.

Furthermore, the reinforcing resin material is supplied widely in the width direction of the side of the electronic component along the side of the electronic component so as to form at least one reinforcing resin layer, and the following process is repeated: the reinforcing resin material at the end position of the at least one reinforcing resin layer is continuously supplied and is moved in the height direction of the electronic component so as to separate from the substrate, and then the reinforcing resin material is folded toward the opposite side in the width direction, wherein the at least one reinforcing resin layer includes a plurality of reinforcing resin layers that are stacked in the height direction of the electronic component. This method can form the reinforcing resin body while continuously supplying the reinforcing resin material, achieving high working efficiency as compared with the reinforcing resin body formed by repeatedly supplying and stopping the reinforcing resin material to form the separate reinforcing resin layers, that is, for each of the reinforcing resin layers.

Moreover, the resin supply unit for supplying the reinforcing resin material includes a supply nozzle, the reinforcing resin material being supplied so as to be deposited on the side of the electronic component as follows: the supply nozzle is disposed near the side of the electronic component, in an upright position relative to the mounting surface of the substrate where the electronic component is mounted, and the supply nozzle is moved along the side of the electronic component while the reinforcing resin material is supplied so as to circumferentially extend larger than the diameter of the supply nozzle.

According to this method, the supply nozzle acting as the resin supply unit for supplying the reinforcing resin material is moved, near the side of the electronic component, in an upright position relative to the mounting surface of the substrate, thereby satisfactorily supplying the reinforcing resin material. This configuration can easily control the posture of the supply nozzle. Moreover, even in the case of a small gap around the electronic component, the reinforcing resin material can be satisfactorily supplied.

According to the present invention, the reinforcing resin body bonded to the substrate and the electronic component includes the multiple reinforcing resin layers that are stacked in the height direction of the raised electronic component so as to be raised from the substrate along the side of the electronic component. Thus, even if the electronic component to be reinforced is a large electronic component that is thick in profile and receives large vibrations and so on, for example, a stress caused by vibrations is spread and absorbed in the contact portion of the reinforcing resin layers, thereby satisfactorily keeping the reinforcing function. Hence, the mounting structure can have high reliability. The reinforcing body includes a resin body that is provided along the side of the electronic component so as to be raised from the substrate, and thus the reinforcing body can be easily supplied according to the size of the electronic component. Moreover, this configuration eliminates the need for forming holes or the like on the substrate, thereby minimizing design restrictions.

The reinforcing resin layers of the reinforcing resin body are stacked in the height direction of the electronic component, the reinforcing resin layer having one end that is extended in the width direction of the side of the electronic component and then is folded toward the opposite side in the width direction so as to continue to one end of another reinforcing resin layer adjacent to the reinforcing resin layer in the height direction of the electronic component. With this configuration, the reinforcing resin layers vertically adjacent to each other are stacked on top of each other in the vertical direction with the ends folded in a continuous manner. Hence, the connecting portion of the ends of the reinforcing resin layers also elastically absorbs a stress caused by vibrations, thereby further improving the stress absorbing function. This can more satisfactorily keep the reinforcing function, allowing the mounting structure to have higher reliability.

Furthermore, the reinforcing resin layers of the reinforcing resin body decrease in dimension in the width direction of the side of the electronic component as the height from the substrate increases or the reinforcing resin layers decrease in thickness along the side of the electronic component as the height from the substrate increases. This configuration can satisfactorily reinforce the electronic component in a relatively stable state with the reinforcing resin body having a small volume, thereby reducing the manufacturing cost and the weight of the mounting structure.

Moreover, the reinforcing resin body covers at least a part of the top surface of the electronic component. With this configuration, the reinforcing resin body covers the top surface of the electronic component as well as the side of the electronic component, thereby increasing the reinforcing force of the reinforcing resin body. This configuration can also improve the reliability of the mounting structure.

According to the method for supplying a reinforcing resin material, the reinforcing resin material is supplied widely in the width direction of the side of the electronic component along the side of the electronic component so as to form the at least one reinforcing resin layer, and the following process is repeated: the reinforcing resin material at the end position of the at least one reinforcing resin layer is continuously supplied and is moved in the height direction of the electronic component so as to separate from the substrate, and then the reinforcing resin material is folded toward the opposite side in the width direction, the at least one reinforcing resin layer including multiple reinforcing resin layers stacked in the height direction of the electronic component. This method can form the reinforcing resin body with high working efficiency and thus reduce the manufacturing process and the manufacturing time of the mounting structure, thereby suppressing the manufacturing cost of the mounting structure.

Moreover, according to the method for supplying a reinforcing resin material, the resin supply unit that supplies the reinforcing resin material includes the supply nozzle. The supply nozzle is disposed near the side of the electronic component, in an upright position relative to the mounting surface of the substrate where the electronic component is mounted, and the supply nozzle is moved along the side of the electronic component while the reinforcing resin material is supplied so as to circumferentially extend larger than the diameter of the supply nozzle. This configuration can easily control the posture of the supply nozzle. Moreover, even in the case of a small gap around the electronic component, the reinforcing resin material can be satisfactorily supplied. The mounting structure can be satisfactorily applied to most electronic components.

DESCRIPTION OF THE EMBODIMENTS

A mounting structure and a method for supplying a reinforcing resin material according to embodiments of the present invention will be described below with reference to the accompanying drawings.

Figure 1A:
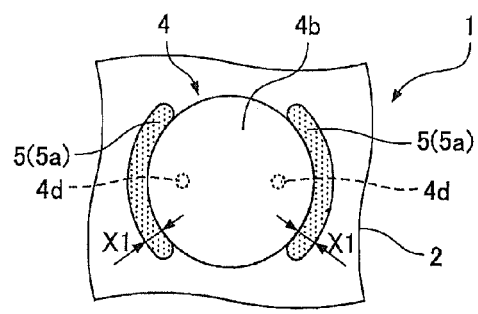
FIG. 1A is a plan view of a mounting structure according to a first embodiment of the present invention.
Figure 1B:
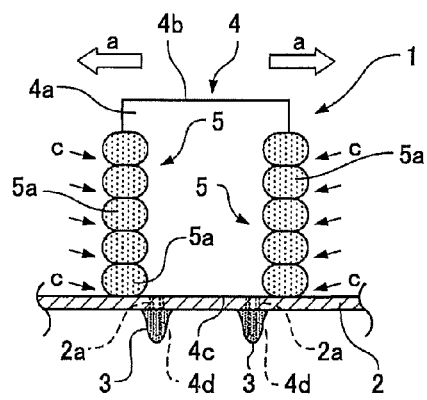
FIG. 1B is a front view of the mounting structure according to the first embodiment.
Figure 1C:
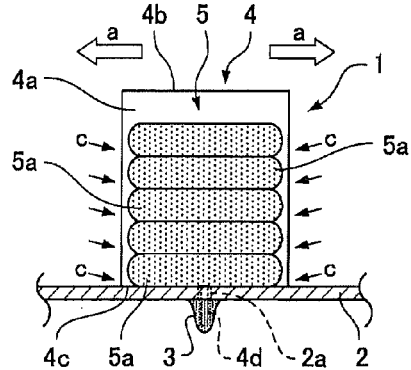
FIG. 1C is a side view of the mounting structure according to the first embodiment.
Figure 1D:
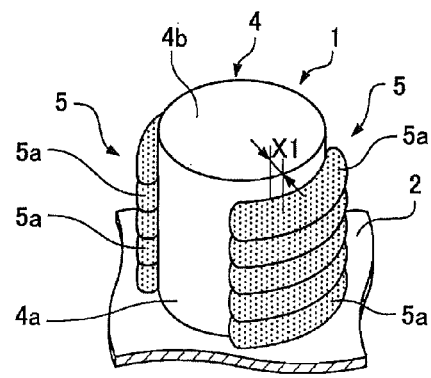
FIG. 1D is a perspective view of the mounting structure according to the first embodiment.
Figure 2A:
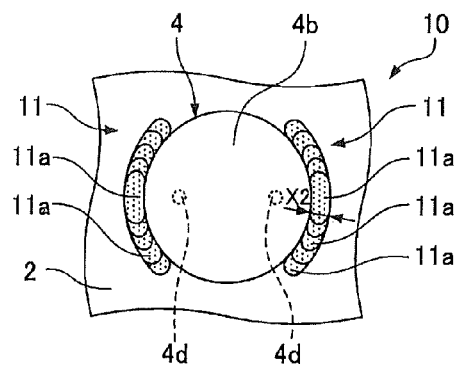
FIG. 2A is a plan view of a mounting structure according to a second embodiment of the present invention.
Figure 2B:
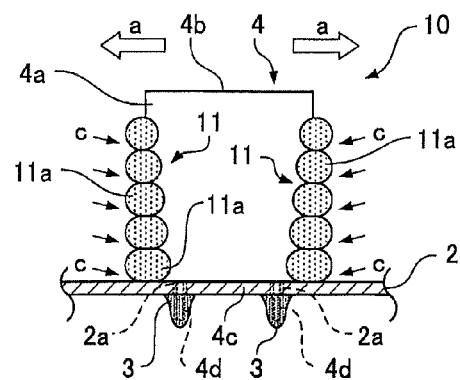
FIG. 2B is a front view of the mounting structure according to the second embodiment.
Figure 2C:
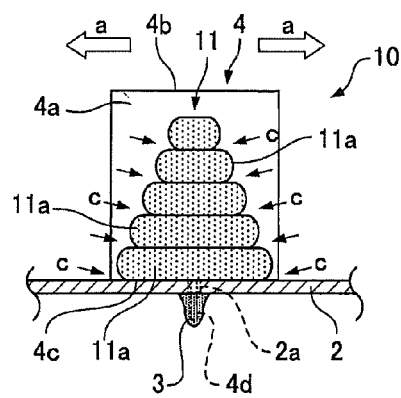
FIG. 2C is a side view of the mounting structure according to the second embodiment.
Figure 2D:
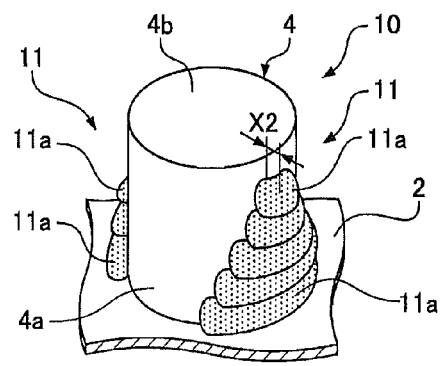
FIG. 2D is a perspective view of the mounting structure according to the second embodiment.
Figure 3A:
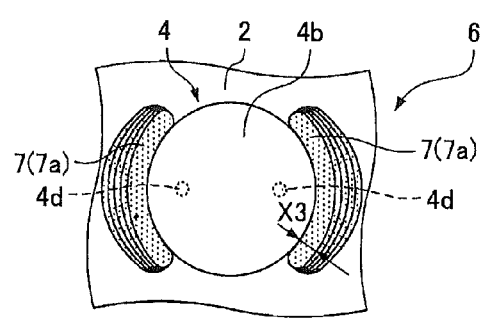
FIG. 3A is a plan view of a mounting structure according to a third embodiment of the present invention.
Figure 3B:
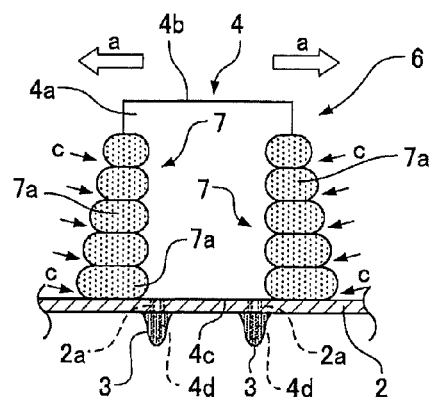
FIG. 3B is a front view of the mounting structure according to the third embodiment.
Figure 3C:
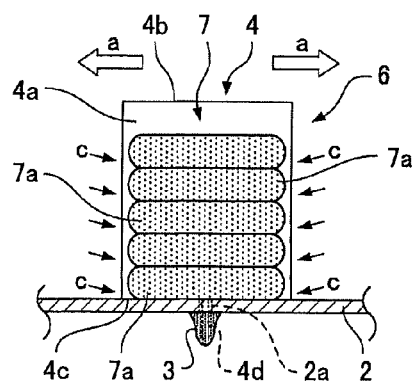
FIG. 3C is a side view of the mounting structure according to the third embodiment.
Figure 3D:
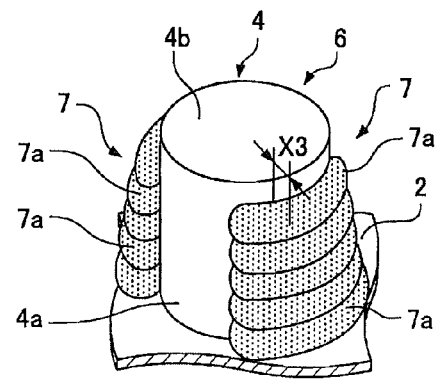
FIG. 3D is a perspective view of the mounting structure according to the third embodiment.
Figure 4A:
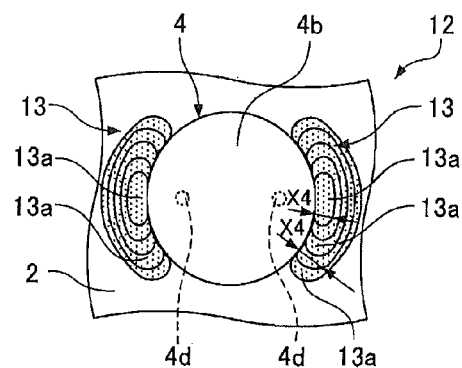
FIG. 4A is a plan view of a mounting structure according to a fourth embodiment of the present invention.
Figure 4B:
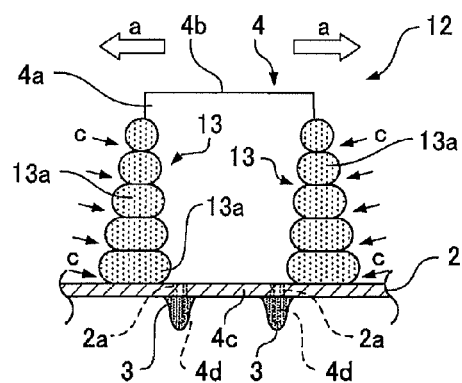
FIG. 4B is a front view of the mounting structure according to the fourth embodiment.
Figure 4C:
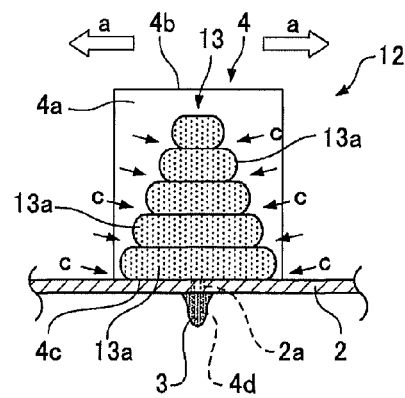
FIG. 4C is a side view of the mounting structure according to the fourth embodiment.
Figure 4D:
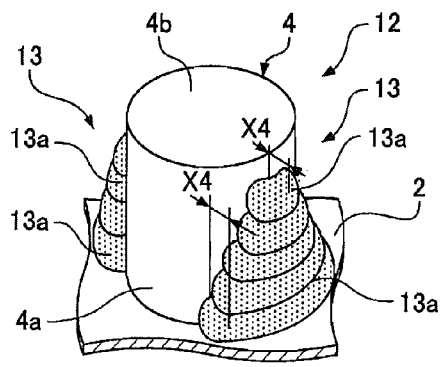
FIG. 4D is a perspective view of the mounting structure according to the fourth embodiment.
Figure 5A:
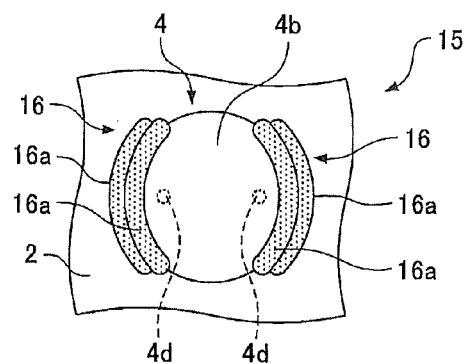
FIG. 5A is a plan view of a mounting structure according to a fifth embodiment of the present invention.
Figure 5B:
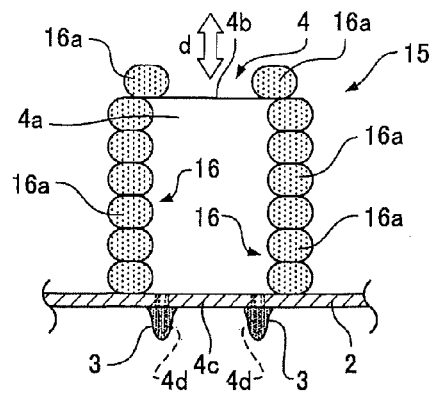
FIG. 5B is a front view of the mounting structure according to the fifth embodiment.
Figure 5C:
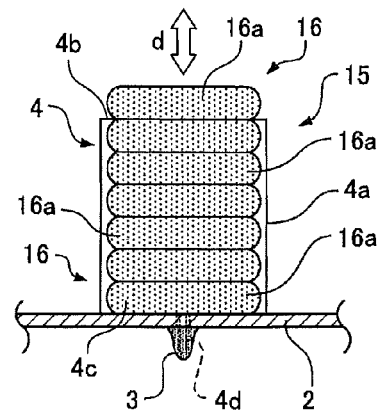
FIG. 5C is a side view of the mounting structure according to the fifth embodiment.
Figure 5D:
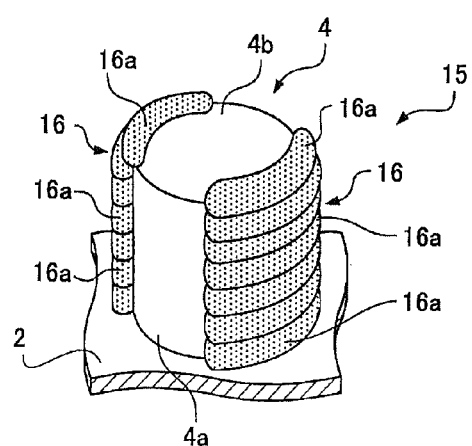
FIG. 5D is a perspective view of the mounting structure according to the fifth embodiment.
Figure 6A:
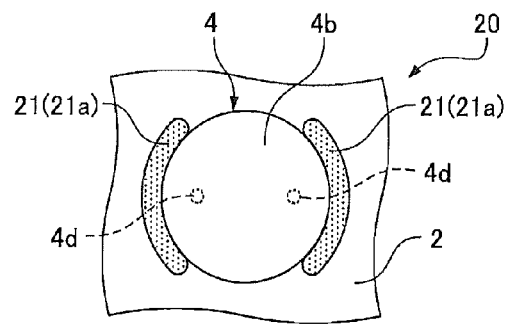
FIG. 6A is a plan view of a mounting structure according to a sixth embodiment of the present invention.
Figure 6B:
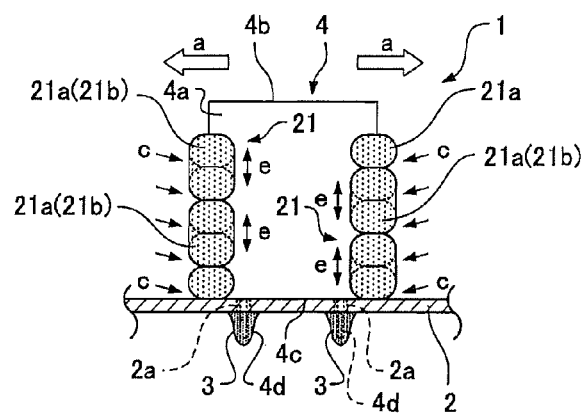
FIG. 6B is a front view of the mounting structure according to the sixth embodiment.
Figure 6C:
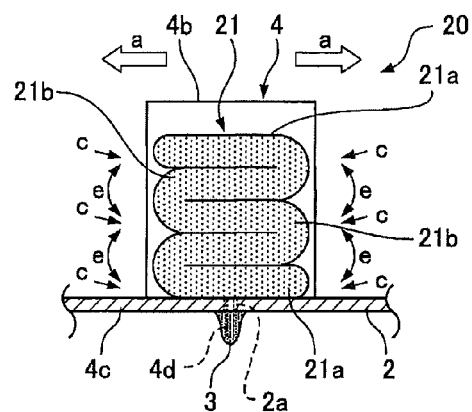
FIG. 6C is a side view of the mounting structure according to the sixth embodiment.
Figure 6D:
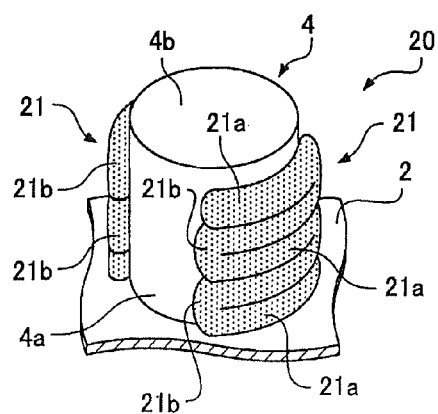
FIG. 6D is a perspective view of the mounting structure according to the sixth embodiment.
Figure 7A:
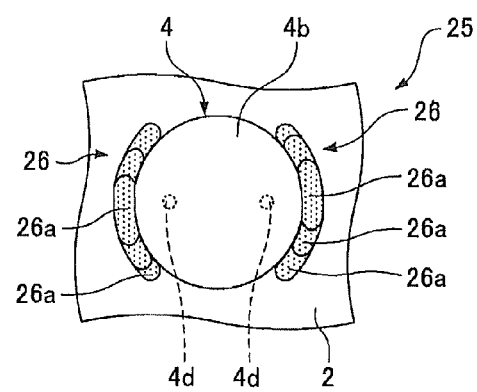
FIG. 7A is a plan view of a mounting structure according to a seventh embodiment of the present invention.
Figure 7B:
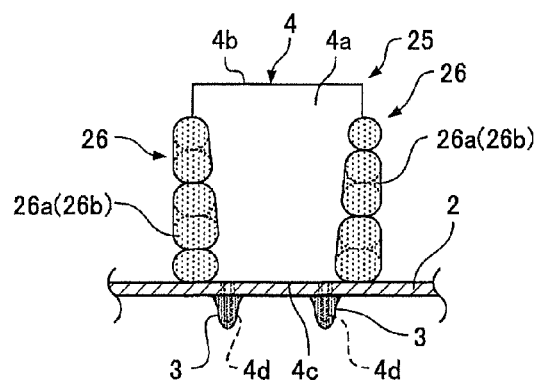
FIG. 7B is a front view of the mounting structure according to the seventh embodiment.
Figure 7C:
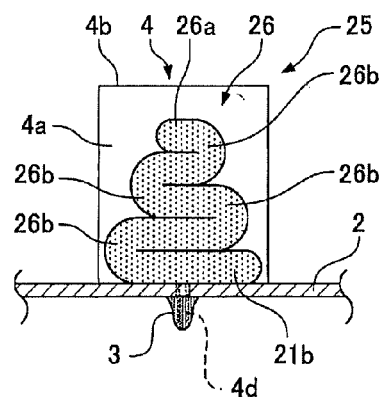
FIG. 7C is a side view of the mounting structure according to the seventh embodiment.
Figure 7D:
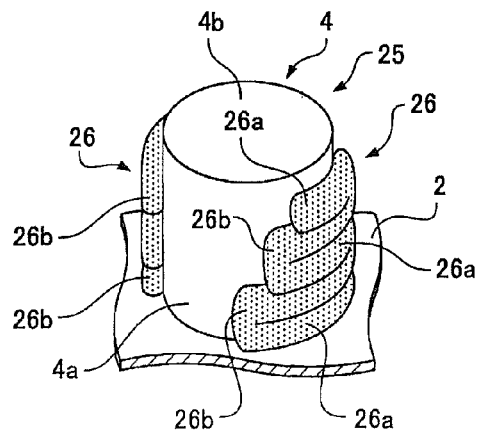
FIG. 7D is a perspective view of the mounting structure according to the seventh embodiment.
Figure 8A:
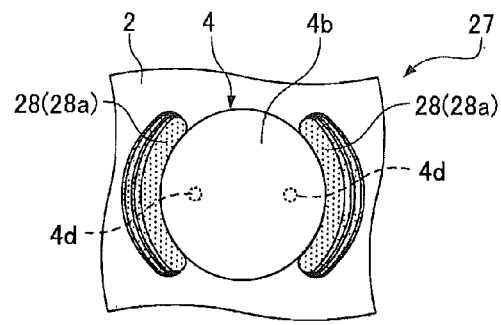
FIG. 8A is a plan view of a mounting structure according to an eighth embodiment of the present invention.
Figure 8B:
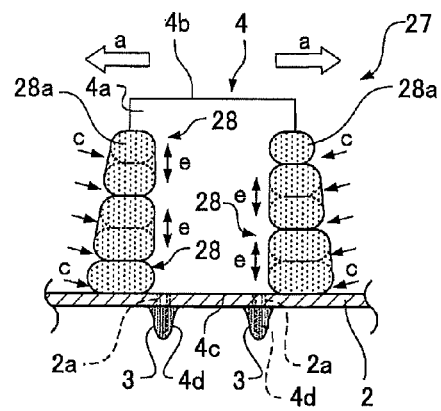
FIG. 8B is a front view of the mounting structure according to the eighth embodiment.
Figure 8C:
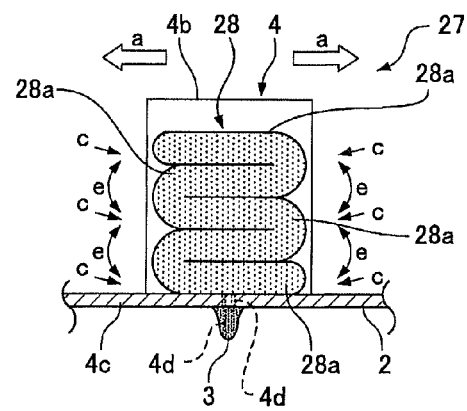
FIG. 8C is a side view of the mounting structure according to the eighth embodiment.
Figure 8D:
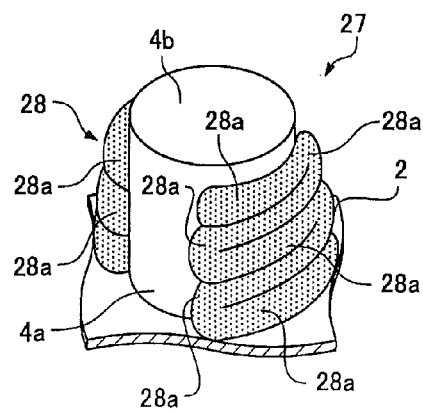
FIG. 8D is a perspective view of the mounting structure according to the eighth embodiment.
Figure 9A:
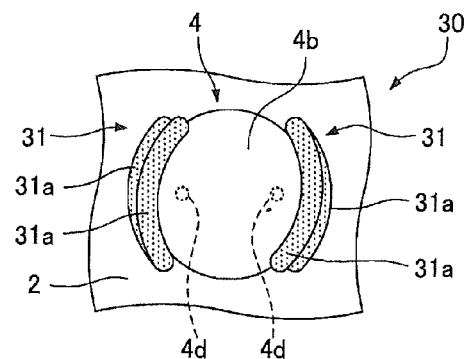
FIG. 9A is a plan view of a mounting structure according to a ninth embodiment of the present invention.
Figure 9B:
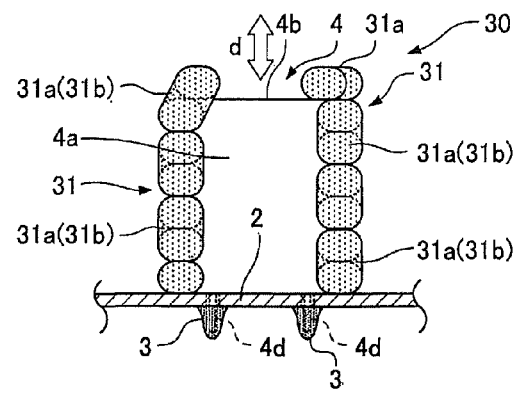
FIG. 9B is a front view of the mounting structure according to the ninth embodiment.
Figure 9C:
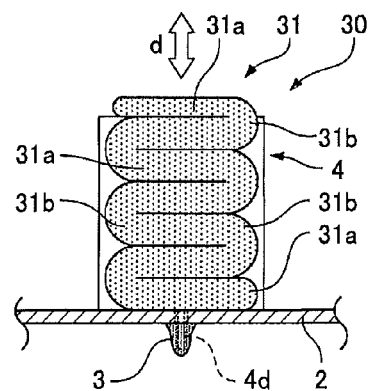
FIG. 9C is a side view of the mounting structure according to the ninth embodiment.
Figure 9D:
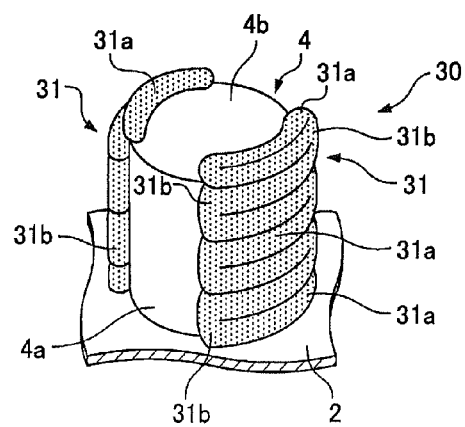
FIG. 9D is a perspective view of the mounting structure according to the ninth embodiment.

FIGS. 1A to 1D show a mounting structure according to a first embodiment of the present invention. FIG. 1A is a plan view, FIG. 1B is a front view, FIG. 1C is a side view, and FIG. 1D is a perspective view. As shown in FIGS. 1A to 1D, a mounting structure 1 includes a substrate (printed circuit board) 2 having a circuit formed at least on the back side of the substrate, a large electronic component 4, e.g., a large capacitor (or transformer) that is raised on the substrate 2 and is mounted so as to be joined with a bonding metal 3 composed of solder, and reinforcing resin bodies 5 that are bonded from the substrate 2 to the electronic component 4.

The electronic component 4 has a side 4a raised from the substrate 2, a top surface 4b at the top of the electronic component 4, and a bottom 4c. Connecting terminals 4d are protruded below from the bottom 4c. The connecting terminals 4d of the electronic component 4 are mounted on the substrate 2 so as to be inserted into through holes 2a formed on the substrate 2. The present embodiment describes the electronic component 4 composed of a large capacitor substantially shaped like a cylinder. The electronic component 4 may be a transformer or the like and is not limited to a large capacitor. In either case, the electronic component 4 is composed of an insertion electronic component that includes the connecting terminals 4d inserted into the through holes 2a of the substrate 2.

In this configuration, the reinforcing resin body 5 includes a plurality of reinforcing resin layers 5a. The reinforcing resin layers 5a each extended in the width direction of the side 4a of the electronic component 4 are stacked in the height direction (in the rising direction) of the electronic component 4 so as to constitute the reinforcing resin body 5. As shown in FIG. 1A, the reinforcing resin bodies 5 are disposed at certain intervals along the outer periphery of the electronic component 4. In the present embodiment, the two reinforcing resin bodies 5 are diagonal to each other (with line symmetry) in plan view.

A reinforcing resin material, the material of the reinforcing resin body 5, is composed of a non-flowable resin (non-flowable applied resin). For example, non-flowable silicone (a viscosity of 20 pa·s and a thixotropy ratio of at least 2) is suitable.

In the present embodiment, the respective reinforcing resin layers 5a are substantially identical in length in the width direction of the side 4a of the electronic component 4 and have a substantially uniform thickness X1 along the side of the electronic component 4. Moreover, the end faces of the reinforcing resin layers 5a adjacent to each other in the height direction of the electronic component 4 are separated from each other. The top surface 4b of the electronic component 4 does not have the reinforcing resin layer 5a.

In the mounting structure 1, the reinforcing resin body 5 includes the reinforcing resin layers 5a that are stacked in the height direction of the raised electronic component 4. Thus, even if the electronic component 4 is a large capacitor or transformer that is relatively heavy and thick in profile from the substrate 2 and, for example, large vibrations a are applied to the mounting structure 1 as shown in FIGS. 1B and 1C, a stress c caused by the vibrations is spread and absorbed in a part where the reinforcing resin layers 5a are vertically stacked in contact with each other (in other words, an upper base and lower base of the reinforcing resin layer 5a), thereby satisfactorily keeping a reinforcing function. Furthermore, the electronic component 4 is reinforced by the reinforcing resin layers 5a disposed along the side 4a of the electronic component 4. This eliminates the need for forming holes or the like for reinforcement on the substrate 2 and hardly restricts the design.

The reinforcing resin body of the mounting structure may cover the whole periphery of the electronic component. In the present embodiment, however, the reinforcing resin bodies 5 are disposed at the intervals along the outer periphery of the electronic component 4, achieving sufficient reinforcing strength. Unlike in the case of the reinforcing resin body covering the whole periphery of the electronic component, the amount of the reinforcing resin material, that is, the material of the reinforcing resin body 5 can be reduced, advantageously allowing the mounting structure 1 to have lower manufacturing cost and lighter weight, accordingly.

In the first embodiment, the respective reinforcing resin layers 5a are substantially identical in length in the width direction of the side 4a of the electronic component 4. The present invention is not limited to this configuration. FIGS. 2A to 2D show a mounting structure according to a second embodiment of the present invention. As shown in FIGS. 2A to 2D, in a mounting structure 10 of the second embodiment, a reinforcing resin body 11 includes reinforcing resin layers 11a that decrease in dimension in the width direction of a side 4a of an electronic component 4 as the height from a substrate 2 increases (in other words, toward the top layer). As shown in FIGS. 1A to 1D and 2A to 2D, the bottom reinforcing resin layer 11a of the reinforcing resin body 11 is in contact with the substrate 2 in the mounting structure 10 according to the second embodiment such that the reinforcing resin layer 11a is identical in dimension to the bottom reinforcing resin layer 5a of the reinforcing resin body 5 in the mounting structure 1 according to the first embodiment in the width direction of the side 4a of the electronic component 4. The mounting structure 10 is identical to the mounting structure 1 of the first embodiment except that the reinforcing resin layers 11a above the bottom layer have different dimensions in the width direction of the side 4a of the electronic component 4.

With this configuration, the reinforcing resin body 11 includes the reinforcing resin layers 11a that decrease in dimension in the width direction of the side 4a of the electronic component 4 as the height from the substrate 2 increases (in other words, toward the top layer). Thus, the electronic component 4 can be reinforced by the reinforcing resin body 11 having a small volume unlike in the case where, as shown in FIGS. 1A to 1D, the bottom reinforcing resin layer 5a in contact with the substrate 2 is identical in dimension to the reinforcing resin layers 5a disposed above the bottom reinforcing resin layer 5a in the width direction of the side 4a of the electronic component 4. This configuration can further reduce the manufacturing cost and weight of the mounting structure 10.

The reinforcing resin layers 11a increase in dimension and receive a larger stress in the width direction of the side 4a of the electronic component 4 as the height from the substrate 2 decreases (in other words, toward the bottom layer). Thus, even if large vibrations a are applied to the mounting structure 10, this configuration allows the reinforcing resin body 11 to satisfactorily reinforce the electronic component 4 in a stable manner.

In the first and second embodiments, the respective reinforcing resin layers 5a and 11a have substantially uniform thicknesses X1 and X2 (see FIGS. 1A, 1D, 2A, and 2D) along the side of the electronic component 4. The present invention is not limited to this configuration. FIGS. 3A to 3D and 4A to 4D show mounting structures according to third and fourth embodiments of the present invention. As shown in FIGS. 3A to 3D and 4A to 4D, in mounting structures 6 and 12 according to the third and fourth embodiments, reinforcing resin layers 7a and 13a decrease in thicknesses X3 and X4 along the side of an electronic component 4 as the height from a substrate 2 increases (in other words, toward the top layer). The mounting structures 6 and 12 are identical to the mounting structures 1 and 10 of the first and second embodiments except that the reinforcing resin layers 7a and 13a above the bottom layer have the varying thicknesses X3 and X4.

With this configuration, reinforcing resin bodies 7 and 13 include the reinforcing resin layers 7a and 13a that decrease in thickness along the side of the electronic component 4 as the height from the substrate 2 increases (in other words, toward the top layer). Thus, the electronic component 4 can be reinforced by the reinforcing resin bodies 7 and 13 having small volumes unlike in the case where the bottom reinforcing resin layer 11a in contact with the substrate 2 is identical in thickness to the reinforcing resin layers disposed above the bottom reinforcing resin layer 11a. This configuration can further reduce the manufacturing costs and weights of the mounting structures 6 and 12.

The reinforcing resin layers 7a and 13a increase in thickness and receive a larger stress along the side of the electronic component 4 as the height from the substrate 2 decreases (in other words, toward the bottom layer). Thus, even if large vibrations a are applied to the mounting structures 6 and 12, this configuration allows the reinforcing resin bodies 7 and 13 to satisfactorily reinforce the electronic component 4 in a stable manner.

In the first to fourth embodiments, the respective reinforcing resin layers 5a, 11a, 7a, and 13a are stacked only along the side 4a of the electronic component 4 so as to constitute the reinforcing resin bodies 5, 11, 6, and 12. The present invention is not limited to this configuration. FIGS. 5A to 5D show a mounting structure 15 according to a fifth embodiment of the present invention. In the mounting structure 15 of the present embodiment, a reinforcing resin body 16 covers a part of a top surface 4b as well as a side 4a of an electronic component 4.

With this configuration, the reinforcing resin body 16 (a reinforcing resin layer 16a on the top) reinforces the electronic component 4 from the top surface 4b as well as the side 4a, thereby increasing a reinforcement force. Specifically, since the reinforcing resin body 16 covers the electronic component 4 also from the top surface 4b, even if large vibrations are applied in a direction, e.g., a vertical direction (the rising direction of the electronic component 4 on a substrate 2) d, the reinforcing resin body 16 can satisfactorily prevent larger vibrations of the electronic component 4. This configuration can improve the reliability of the mounting structure 15.

In the case where the reinforcing resin body 16 (the reinforcing resin layer 16a on the top) covers the electronic component 4 from the top surface 4b as well as the side 4a, the reinforcing resin layers of the reinforcing resin body may decrease in dimension in the width direction of the side of the electronic component as the height from the substrate increases or may decrease in thickness along the side of the electronic component as the height from the substrate increases.

In the first to fifth embodiments, the end faces of each of the reinforcing resin layers 5a, 11a, 7a, 13a, and 16a are separated from each other in the reinforcing resin bodies 5, 11, 6, 12, and 16. The present invention is not limited to this configuration. FIGS. 6A to 6D show a mounting structure 20 according to a sixth embodiment of the present invention. In the mounting structure 20 of the sixth embodiment, one end of a reinforcing resin layer 21a of a reinforcing resin body 21 is extended in the width direction of a side 4a of an electronic component 4 and then is folded toward the opposite side in the width direction so as to continue to one end of another reinforcing resin layer 21a that is adjacent to the reinforcing resin layer 21a in the height direction of the electronic component 4. Thus, the reinforcing resin layers 21a with the joined ends are stacked in the height direction of the electronic component 4.

With this configuration, the reinforcing resin layers 21a vertically adjacent to each other are vertically stacked in contact with each other with the ends folded in a continuous manner. Thus, a joint 21b also elastically absorbs a stress caused by vibrations, thereby more satisfactorily keeping a reinforcing function. In other words, the joint 21b between the reinforcing resin layers 21a allows the overall reinforcing resin body 21 to absorb a stress applied to the electronic component 4; meanwhile, the reinforcing resin body 21 is deformed in direction e like a curved spring. Thus, the reinforcing function can be quite satisfactorily kept so as to further improve the reliability of the mounting structure 20.

As shown in FIGS. 7A to 7D, as in the mounting structure 20 of the sixth embodiment, one end of a reinforcing resin layer 26a of a reinforcing resin body 26 is extended in the width direction of a side 4a of an electronic component 4 and then is folded toward the opposite side in the width direction so as to continue to one end of another reinforcing resin layer 26a that is adjacent to the reinforcing resin layer 26a in the height direction of the electronic component 4. In this state, the reinforcing resin layer 26a of the reinforcing resin body 26 may constitute a mounting structure 25 so as to decrease in dimension in the width direction of the side 4a of the electronic component 4 as the height from a substrate 2 increases (in other words, toward the top layer) (Seventh Embodiment). Also in this configuration, a joint 26b between the reinforcing resin layers 26a can absorb a stress applied to the electronic component 4. Thus, the reinforcing function can be quite satisfactorily kept so as to improve the reliability of the mounting structure 25.

As shown in FIGS. 8A to 8D, as in the mounting structure 20 of the sixth embodiment, one end of a reinforcing resin layer 28a of a reinforcing resin body 28 is extended in the width direction of a side 4a of an electronic component 4 and then is folded toward the opposite side in the width direction so as to continue to one end of another reinforcing resin layer 28a that is adjacent to the reinforcing resin layer 28a in the height direction of the electronic component 4. In this state, the reinforcing resin layer 28a of the reinforcing resin body 28 may constitute a mounting structure 27 so as to decrease in thickness along the side of the electronic component 4 as the height from a substrate 2 increases (in other words, toward the top layer) (Eighth Embodiment). Also in this configuration, a joint 28b between the reinforcing resin layers 28a can absorb a stress applied to the electronic component 4. Thus, the reinforcing function can be quite satisfactorily kept so as to improve the reliability of the mounting structure 27.

As shown in FIGS. 9A to 9D, as in the mounting structure 20 of the sixth embodiment, one end of a reinforcing resin layer 31a of a reinforcing resin body 31 is extended in the width direction of a side 4a of an electronic component 4 and then is folded toward the opposite side in the width direction so as to continue to one end of another reinforcing resin layer 31a that is adjacent to the reinforcing resin layer 31a in the height direction of the electronic component 4. In this state, the reinforcing resin layer 31a of the reinforcing resin body 31 may cover a part of a top surface 4b as well as the side 4a of the electronic component 4 so as to constitute a mounting structure 30 (Ninth Embodiment).

Also in this configuration, a joint 31b between the reinforcing resin layers 31a can absorb a stress applied to the electronic component 4. Thus, the reinforcing function can be quite satisfactorily kept so as to improve the reliability of the mounting structure 30. The reinforcing resin body 31 (the reinforcing resin layer 31a on the top) reinforces the electronic component 4 from the top surface 4b as well as the side 4a, thereby increasing a reinforcement force. Specifically, since the reinforcing resin body 31 covers the electronic component 4 also from the top surface 4b, even if large vibrations are applied in a direction, e.g., a vertical direction (the rising direction of the electronic component 4 on a substrate 2) d, the reinforcing resin body 31 can satisfactorily prevent larger vibrations of the electronic component 4. This configuration can improve the reliability of the mounting structure 30.

Figure 10A:
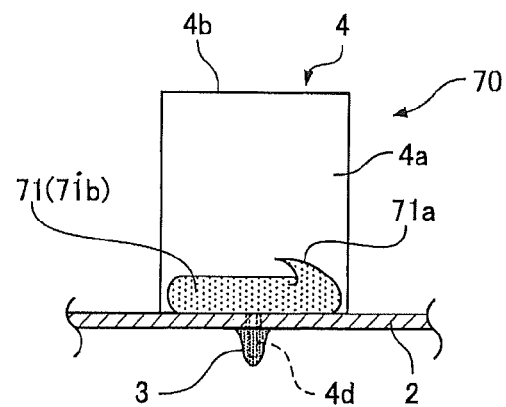
FIG. 10A is a side view of a mounting structure not relating to the embodiments of the present invention.
Figure 10B:
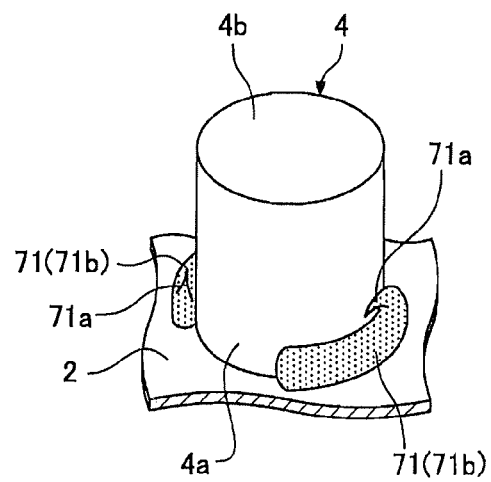
FIG. 10B is a front view of the mounting structure not relating to the embodiments of the present invention.

As shown in FIGS. 10A and 10B, even in the case of a reinforcing resin body 71 not including a plurality of layers in a mounting structure 70, the reinforcing resin body 71 extended in the width direction of a side 4a of an electronic component 4 has an end 71a that is folded toward the opposite side in the width direction so as to prevent drips of an applied (supplied) reinforcing resin material from the end 71a. The mounting structure 70 configured thus is not included in the present invention. In other words, in the mounting structure 70 configured thus, the volume of the second reinforcing resin layer (the end 71a of the reinforcing resin body 71) from the bottom in the height direction of the electronic component 4 is considerably smaller than, specifically, less than a quarter of the volume of the bottom reinforcing resin layer (a main unit 71b of the reinforcing resin body 71) in contact with a substrate 2.

Practically, the reinforcing resin body 71 does not include stacked reinforcing resin layers and thus is naturally unable to absorb a stress unlike at the contact points or joints of the reinforcing resin layers 5a, 11a, 7a, 13a, 16a, 21a, 26a, and 31a of the reinforcing resin bodies 5, 11, 7, 13, 16, 21, 26, and 31 according to the embodiments of the present invention. Hence, the effect of reinforcing the electronic component 4 cannot be obtained. In other words, in the reinforcing resin bodies 5, 11, 7, 13, 16, 21, 26, and 31 according to the embodiments of the present invention, the volumes of the second reinforcing resin layers 5a, 11a, 7a, 13a, 16a, 21a, 26a, and 31a from the bottoms in the height direction of the electronic component 4 are, respectively, at least quarters of the volumes of the bottom reinforcing resin layers 5a, 11a, 7a, 13a, 16a, 21a, 26a, and 31a in contact with the substrate 2. This configuration obtains the effect of satisfactorily reinforcing the electronic component 4.

Figure 11A:
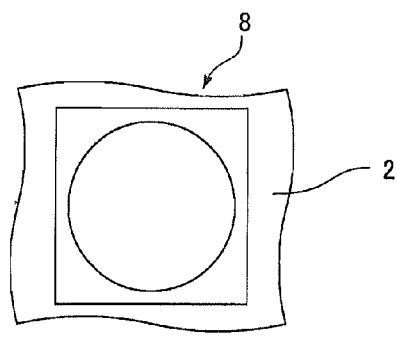
FIG. 11A is a plan view of an electronic component and a substrate that are used for a mounting structure according to a tenth embodiment of the present invention.
Figure 11B:
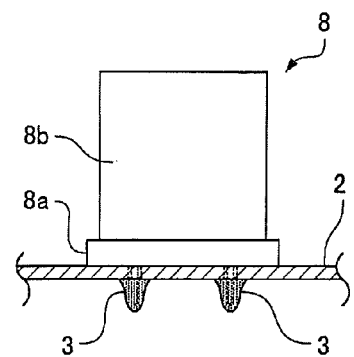
FIG. 11B is a side view of the electronic component and the substrate that are used for the mounting structure according to the tenth embodiment.
Figure 11C:
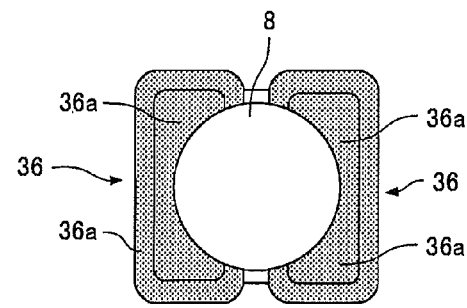
FIG. 11C is a plan view of the mounting structure according to the tenth embodiment.
Figure 11D:
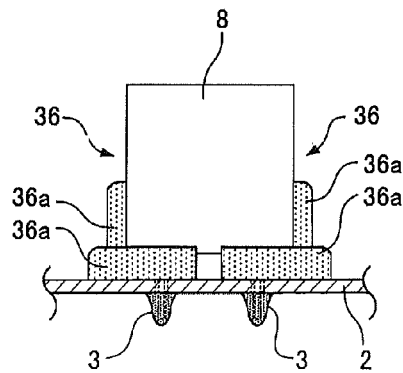
FIG. 11D is a side view of the mounting structure according to the tenth embodiment.

In the foregoing embodiments, the electronic component 4 is cylindrical. The electronic component 4 is not limited to the cylindrical shape. For example, rectangular components such as a transformer are usable. As shown in FIGS. 11A and 11B, a reinforcing resin body 36 may be similarly configured for electronic components of varying shapes, e.g., an electronic component 8 having a square bottom and cylindrical upper and intermediate parts (Tenth Embodiment). Specifically, as shown in FIGS. 11C and 11D, the reinforcing resin body 36 includes a plurality of reinforcing resin layers 36a. The reinforcing resin layers 36a only need to be stacked in the height direction of the raised electronic component 8 so as to extend along sides 8a and 8b of the electronic component 8, the sides 8a and 8b being raised from a substrate 2. The reinforcing resin body 36 configured thus can satisfactorily reinforce the electronic component 8.

Eleventh and Twelfth Embodiments

Figure 12A:
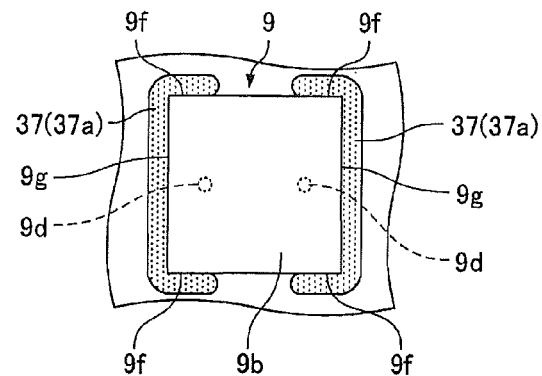
FIG. 12A is a plan view of a mounting structure according to an eleventh embodiment of the present invention.
Figure 12B:
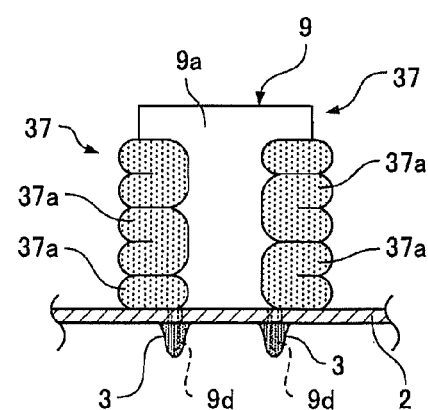
FIG. 12B is a front view of the mounting structure according to the eleventh embodiment.
Figure 12C:
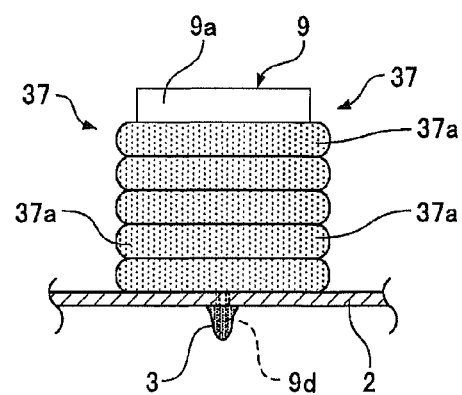
FIG. 12C is a side view of the mounting structure according to the eleventh embodiment.
Figure 13A:
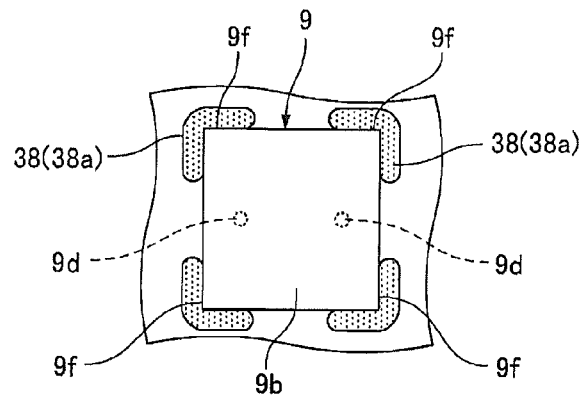
FIG. 13A is a plan view of a mounting structure according to a twelfth embodiment of the present invention.
Figure 13B:
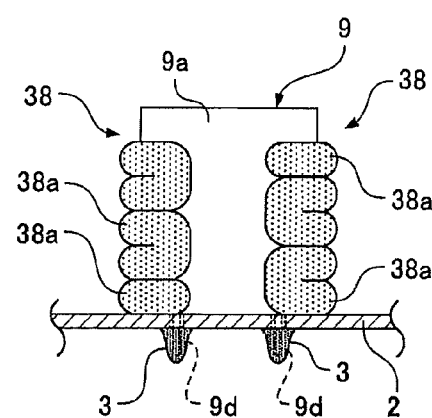
FIG. 13B is a front view of the mounting structure according to the twelfth embodiment.
Figure 13C:
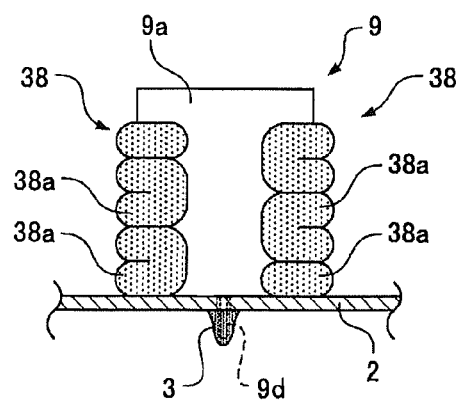
FIG. 13C is a side view of the mounting structure according to the twelfth embodiment.

FIGS. 12A to 12C and 13A to 13C show a rectangular electronic component 9. As shown in FIGS. 12A to 12C, two reinforcing resin bodies 37 and reinforcing resin layers 37a constituting the reinforcing resin bodies 37 may be formed over one sides 9g as well as corners 9f of the electronic component 9. As shown in FIGS. 13A to 13C, four reinforcing resin bodies 38 and reinforcing resin layers 38a constituting the reinforcing resin bodies 38 may be formed only over corners 9f of the electronic component 9.

In FIGS. 12A to 12C and 13A to 13C, reference numeral 9a denotes the side of the electronic component 9, reference numeral 9b denotes the top surface of the electronic component 9, and reference numeral 9d denotes the connecting terminals of the electronic component 9. Moreover, in FIGS. 12A to 12C and 13A to 13C, one ends of the reinforcing resin layers 37a and 38a of the reinforcing resin bodies 37 and 38 are extended in the width direction of the side 9a of the electronic component 9 and then are folded toward the opposite side in the width direction so as to continue to one ends of other reinforcing resin layers 37a and 38a that are adjacent to the reinforcing resin layers 37a and 38a in the height direction of the electronic component 9. The present invention is not limited to this configuration. The reinforcing resin layers 37a and 38a vertically adjacent to each other may have separated end faces. As in the second and seventh embodiments, the mounting structure may be configured such that the reinforcing resin layers 37a and 38a of the reinforcing resin body 37 decrease in dimension in the width direction of the side 9a of the electronic component 9 as the height from a substrate 2 increases (in other words, toward the top layer). Alternatively, as in the third and eighth embodiments, the mounting structure may be configured such that the reinforcing resin layers 37a and 38a of the reinforcing resin body 37 decrease in thickness along the side of the electronic component 9 as the height from the substrate 2 increases (in other words, toward the top layer). Alternatively, as in the fifth and ninth embodiments, the reinforcing resin layers 37a and 38a may cover a part of the top surface 9b as well as the side 9a of the electronic component 9.

Figure 30A:
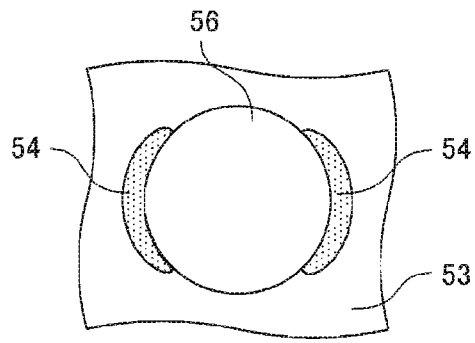
FIG. 30A is a plan view of a mounting structure reinforced by another conventional reinforcing resin.
Figure 30B:
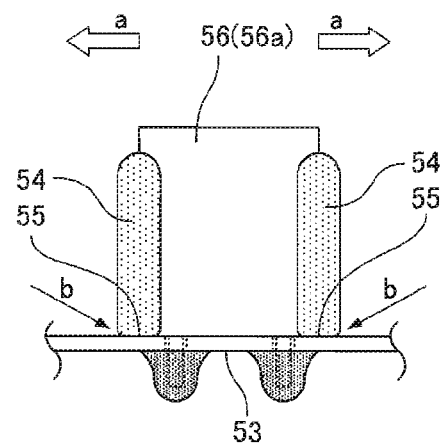
FIG. 30B is a front view of the mounting structure reinforced by the other conventional reinforcing resin.
Figure 30C:
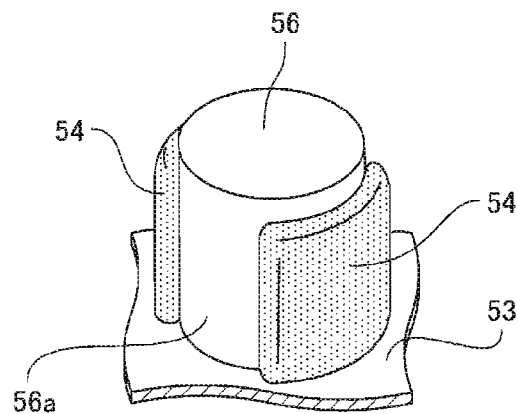
FIG. 30C is a perspective view of the mounting structure reinforced by the other conventional reinforcing resin.
Figure 31:
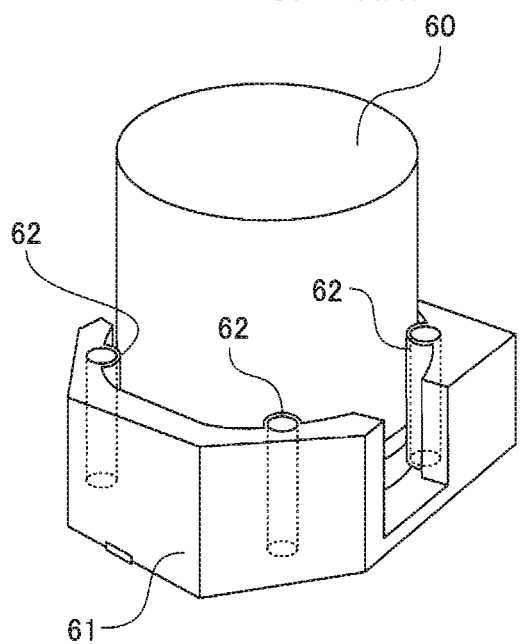
FIG. 31 is a perspective view of a mounting structure reinforced by still another conventional reinforcing resin.

The mounting structure according to the embodiment of the present invention allows the reinforcing resin body 38 to satisfactorily reinforce the electronic component, reliably preventing damage to the electronic component. For example, as shown in FIGS. 30A to 30C, when drop tests were repeated eight times at 2 m for the mounting structure including the reinforcing resin 54 simply vertically applied along the side 56a of the electronic component 56, the stress b concentrated at the joint 55 between the reinforcing resin 54 and the substrate 53, at the bottom of the reinforcing resin 54. This separated the reinforcing resin 54 from the substrate 53 so as to deteriorate the reinforcing function.

In contrast to this configuration, for example, in the mounting structure 20 shown in FIGS. 6A to 6D according to the embodiment of the present invention, bonding of the reinforcing resin body 21 to the electronic component 4 and the substrate 2 was satisfactorily kept even after drop tests were repeated thirty times at 2 m. Thus, the electronic component 4 was satisfactorily reinforced and protected by the reinforcing resin body 21.

Referring to FIGS. 14A to 15B, a method for supplying a reinforcing resin material 40 of the reinforcing resin body will be described below. The reinforcing resin material 40 is supplied to the substrate 2 and the electronic component 4 so as to join the electronic component 4 and the substrate 2. The electronic component 4 raised on the substrate 2 is joined and mounted with solder, which serves as the bonding metal 3, before the reinforcing resin material 40 is supplied.

Figure 14A:
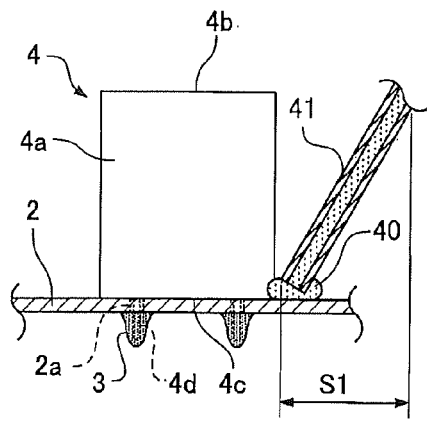
FIG. 14A is a front view showing a state at the beginning of the application (supply) of a reinforcing resin material in a method for supplying the reinforcing resin material according to thirteenth and fourteenth embodiments of the present invention.
Figure 14B:
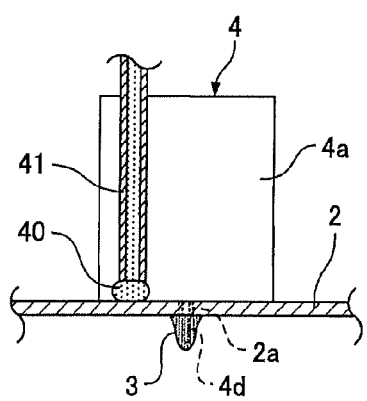
FIG. 14B is a side view showing a state at the beginning of the application (supply) of the reinforcing resin material in the method for supplying the reinforcing resin material according to the thirteenth and fourteenth embodiments.
Figure 14C:
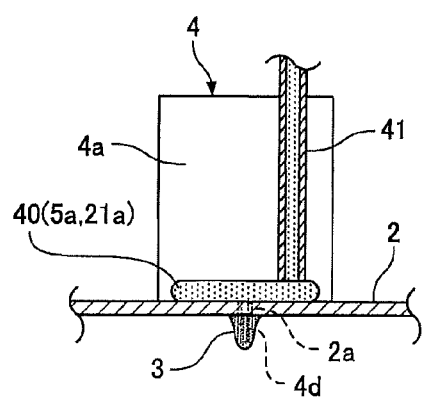
FIG. 14C is a side view showing a state at the beginning of the application (supply) of the reinforcing resin material in the method for supplying the reinforcing resin material according to the thirteenth and fourteenth embodiments.
Figure 14D:
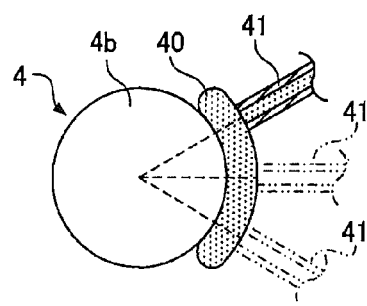
FIG. 14D is a plan view showing a state at the beginning of the application (supply) of the reinforcing resin material in the method for supplying the reinforcing resin material according to the thirteenth and fourteenth embodiments.
Figure 15A:
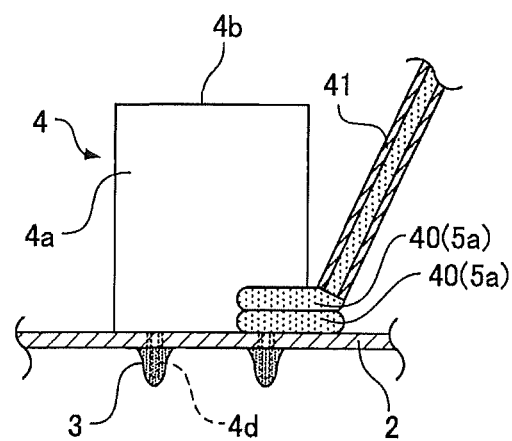
FIG. 15A is a front view showing a state during the application (supply) of the reinforcing resin material in the method for supplying the reinforcing resin material according to the thirteenth embodiment of the present invention.
Figure 15B:
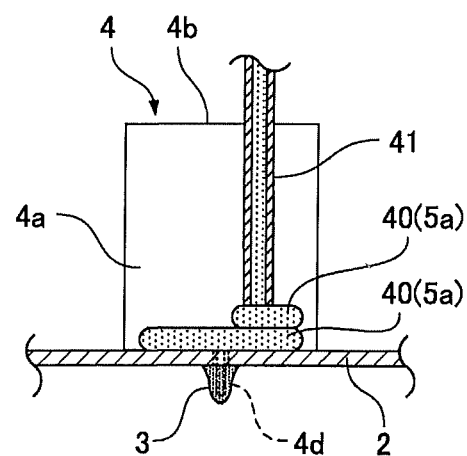
FIG. 15B is a side view showing a state during the application (supply) of the reinforcing resin material in the method for supplying the reinforcing resin material according to the thirteenth embodiment of the present invention.
Figure 16A:
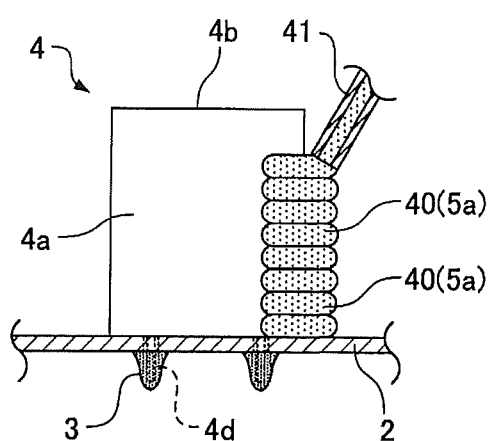
FIG. 16A is a front view showing a state immediately before the end of the application (supply) of the reinforcing resin material in the method for supplying the reinforcing resin material according to the thirteenth embodiment.
Figure 16B:
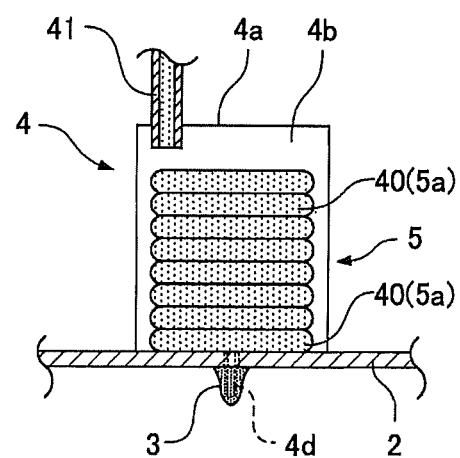
FIG. 16B is a side view showing a state at the completion of the application (supply) of the reinforcing resin material in the method for supplying the reinforcing resin material according to the thirteenth embodiment.
Figure 17A:
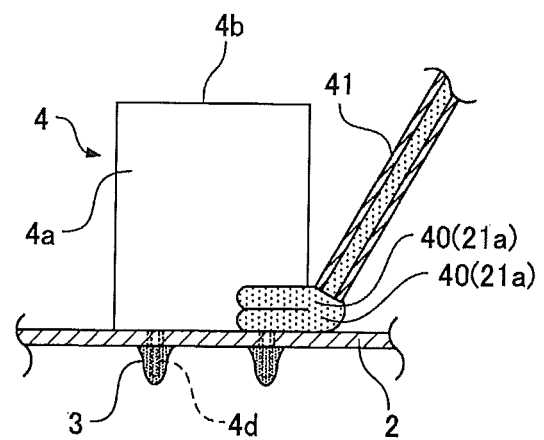
FIG. 17A is a front view showing a state during the application (supply) of the reinforcing resin material in the method for supplying the reinforcing resin material according to the fourteenth embodiment of the present invention.
Figure 17B:
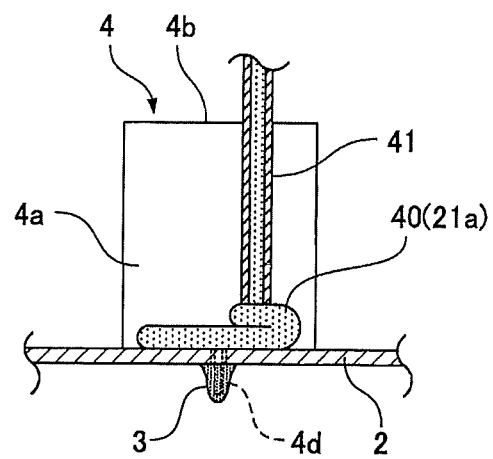
FIG. 17B is a side view showing a state during the application (supply) of the reinforcing resin material in the method for supplying the reinforcing resin material according to the fourteenth embodiment.
Figure 18A:
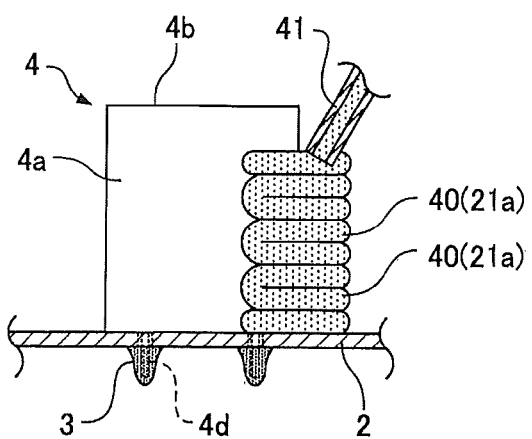
FIG. 18A is a front view showing a state immediately before the end of the application (supply) of the reinforcing resin material in the method for supplying the reinforcing resin material according to the fourteenth embodiment.
Figure 18B:
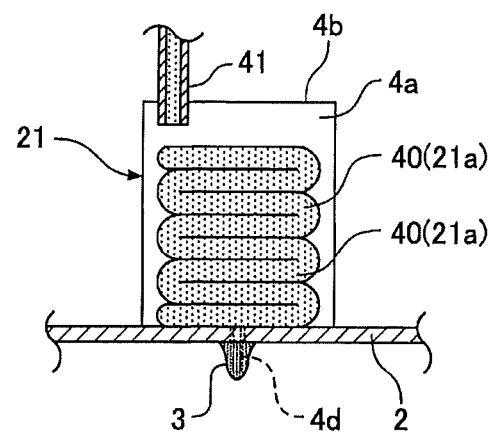
FIG. 18B is a side view showing a state at the completion of the application (supply) of the reinforcing resin material in the method for supplying the reinforcing resin material according to the fourteenth embodiment.

In FIGS. 14A to 16B, the reinforcing resin material 40 of the reinforcing resin layer 5a of the reinforcing resin body 5 is applied (supplied) in the production of the mounting structure 1 according to the first embodiment of the present invention. FIGS. 14A to 14D show a state at the beginning of the application (supply) of the reinforcing resin material 40. FIG. 14A is a front view, FIGS. 14B and 14C are side views, and FIG. 14D is a plan view. FIGS. 15A and 15B show a state during the application (supply) of the reinforcing resin material 40. FIG. 15A is a front view and FIG. 15B is a side view. FIG. 16A is a front view showing a state immediately before the end of the application (supply) of the reinforcing resin material 40. FIG. 16B is a side view showing a state at the completion of the application (supply) of the reinforcing resin material 40.

A feature of the method for supplying the reinforcing resin material 40 according to the embodiment of the present invention is that the reinforcing resin material 40 is supplied (applied) from a supply nozzle (application nozzle) 41, which acts as a resin supply unit, so as to extend in the width direction of the side 4a along the side 4a of the electronic component 4; meanwhile, the reinforcing resin material 40 is stacked by moving the supply nozzle 41 from the bottom layer in the height direction of the electronic component 4. In the supply of the reinforcing resin material 40, the reinforcing resin layer may be formed by the supply nozzle 41 with varying movements and traveling speeds while the amount of supply (the amount of coating) of the reinforcing resin material 40 is kept constant. Alternatively, in the formation of the reinforcing resin layer, the supply nozzle 41 may travel with a constant speed and the reinforcing resin material 40 may be supplied with varying amounts. This method can form the reinforcing resin layers stacked with any thickness and height.

(A Method for Supplying the Reinforcing Resin Material According to a Thirteenth Embodiment)

In the case of FIGS. 14A to 16B, the reinforcing resin material 40 is applied along the side 4a of the electronic component 4 with the supply nozzle 41 tilted diagonally downward as shown in FIGS. 14A, 14D, and 15A. When the reinforcing resin material 40 reaches the end of the reinforcing resin layer 5a, the supply of the reinforcing resin material 40 is temporarily stopped. After that, the supply nozzle 41 is moved upward in the rising direction of the electronic component 4, and then the supply of the reinforcing resin material 40 is restarted to stack the reinforcing resin layer 5a, forming the reinforcing resin body 5. Furthermore, the reinforcing resin bodies 11 and 16 according to the second and third embodiments can be formed by the same method.

This method can satisfactorily form the reinforcing resin body 5 including the stacked reinforcing resin layers 5a. However, the supply of the reinforcing resin material 40 is temporarily stopped after one of the reinforcing resin layers 5a is formed. This requires relatively a long time, leading to low production efficiency.

(A Method for Supplying the Reinforcing Resin Material According to a Fourteenth Embodiment)

FIGS. 14A to 14D, 17A, 17B, 18A, and 18B show a method for supplying the reinforcing resin material 40 in the production of the mounting structure 20 according to the sixth embodiment. As shown in FIGS. 17A, 17B, 18A, and 18B, in the present embodiment, the following process is repeated: the reinforcing resin material 40 at the end position of the reinforcing resin layer 21a is continuously supplied and is moved so as to separate from the substrate 2 in the height direction of the electronic component 4, and then the reinforcing resin material 40 is folded toward the opposite side in the width direction.

Also in this method, the reinforcing resin layers 21a are stacked in the height direction of the electronic component 4 so as to form the reinforcing resin body 21. In this method, particularly, the reinforcing resin layers 5a can be successively formed without stopping the supply of the reinforcing resin material 40. This can shorten the time of a manufacturing process, improving production efficiency.

Figure 19:
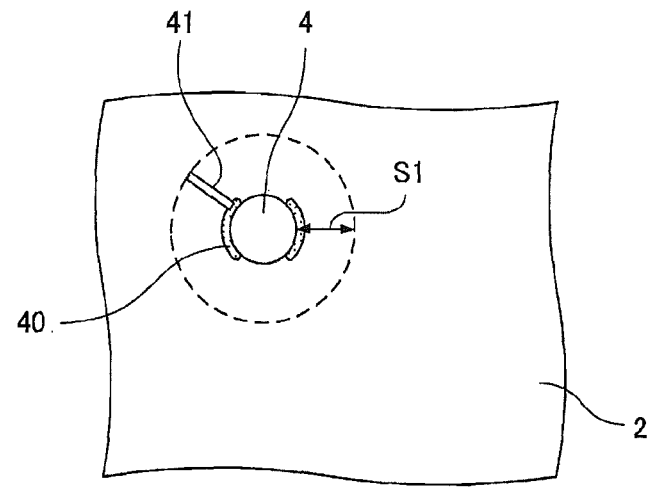
FIG. 19 is a plan view schematically showing a drawback in the method for supplying the reinforcing resin material according to the thirteenth and fourteenth embodiments of the present invention.

In the method for supplying the reinforcing resin material according to the thirteenth and fourteenth embodiments, however, the reinforcing resin material 40 is applied along the side 4a of the electronic component 4 with the supply nozzle 41 tilted diagonally downward. As shown in FIG. 19, a relatively large clearance S1 is necessary near the electronic component 4. Thus, in the absence of the clearance S1, the reinforcing resin material 40 cannot be satisfactorily applied, leading to dimensional restrictions.

Figure 20:
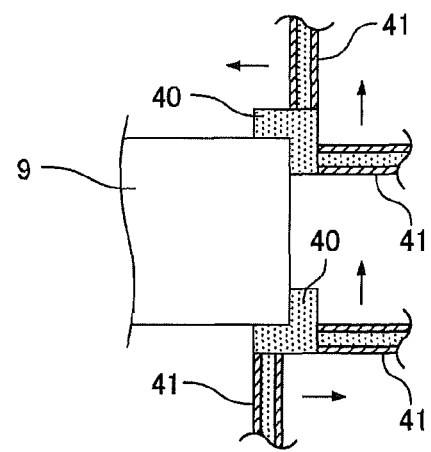
FIG. 20 is a plan view schematically showing a method for supplying a reinforcing resin material to a rectangular electronic component according to the present invention.

The supply nozzle 41 is held and moved by, for example, a robot arm that is movable in three dimensions. In this case, positioning in θ direction needs to be linked to movements in X, Y, and Z directions such that the reinforcing-resin discharge port of the supply nozzle 41 is held at an angle of inclination with a certain space from the side of the electronic component. Unfortunately, this may complicate the posture control of the robot arm and the supply nozzle 41. FIG. 20 schematically shows the method for supplying (applying) the reinforcing resin material 40 to the rectangular electronic component 9. The reinforcing resin layers 37a and 38a and the reinforcing resin bodies 37 and 38 can be formed by the same method for supplying the reinforcing resin material but have the same drawback.

(A Method for Supplying the Reinforcing Resin Material According to Fifteenth and Sixteenth Embodiments)

FIGS. 21A to 26 show a method for supplying the reinforcing resin material that can remove the drawback. As shown in FIGS. 21A to 21D, 22A, 22B, 23A, and 23B, in the present embodiment, the supply nozzle 41 is disposed near the side of the electronic component 4, in an upright position relative to the mounting surface of the substrate 2 where the electronic component 4 is mounted. Moreover, the reinforcing resin material 40 is supplied with a diameter L3 circumferentially extended larger than the total dimension of a diameter L1 of the supply nozzle 41 and double a clearance L2 between the electronic component 4 and the supply nozzle 41. In other words, the reinforcing resin material 40 is supplied so as to satisfy L3>(L1+2·L2) (see FIG. 21A). The clearance L2 between the supply nozzle 41 and the electronic component 4 may have a minimum dimension larger than a displacement error, that is, an extremely small dimension.

Figure 26:
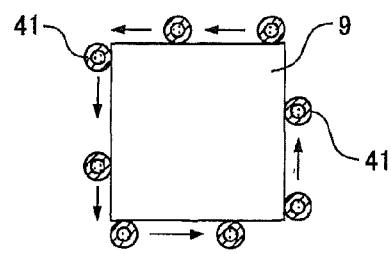
FIG. 26 is a plan view schematically showing a method for supplying a reinforcing resin material to a rectangular electronic component according to the present invention.

FIGS. 21A to 21D, 22A, 22B, 23A, and 23B show the application of the reinforcing resin material 40 when the mounting structure 1 is manufactured according to the first embodiment of the present invention (A method for supplying the reinforcing resin material according to a fifteenth embodiment). FIGS. 21A to 21D, 24A, 24B, 25A, and 25B show the application of the reinforcing resin material 40 when the mounting structure 20 is manufactured according to the sixth embodiment of the present invention (A method for supplying the reinforcing resin material according to a sixteenth embodiment). FIG. 26 schematically shows a method for supplying (applying) the reinforcing resin material 40 to the rectangular electronic component 9.

According to the supplying method, the reinforcing resin material 40 can be applied by the supply nozzle 41 that is kept in an upright position and is not inclined. Thus, the reinforcing resin material 40 can be satisfactorily applied (supplied) as long as a dimension near the electronic component 4 is substantially equal to the diameter of the supply nozzle 41 (precisely, the total dimension of the diameter L1 of the supply nozzle 41 and the clearance L2 between the supply nozzle 41 and the electronic component 4).

Figure 21A:
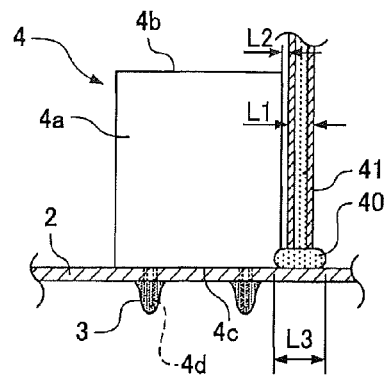
FIG. 21A is a front view showing a state at the beginning of the application (supply) of a reinforcing resin material in a method for supplying the reinforcing resin material according to fifteenth and sixteenth embodiments of the present invention.
Figure 21B:
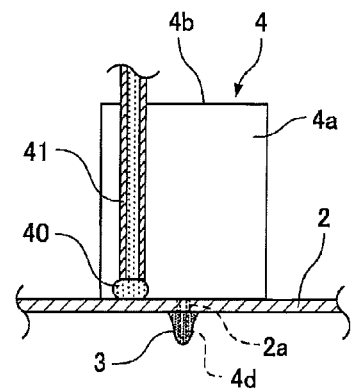
FIG. 21B is a side view showing a state at the beginning of the application (supply) of the reinforcing resin material in the method for supplying the reinforcing resin material according to the fifteenth and sixteenth embodiments.
Figure 21C:
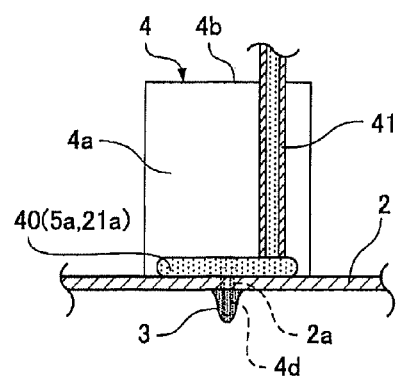
FIG. 21C is a side view showing a state at the beginning of the application (supply) of the reinforcing resin material in the method for supplying the reinforcing resin material according to the fifteenth and sixteenth embodiments.
Figure 21D:
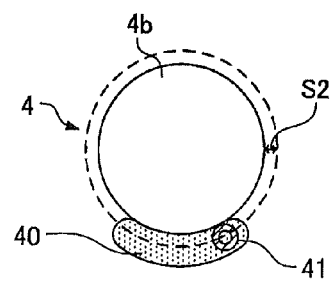
FIG. 21D is a plan view showing a state at the beginning of the application (supply) of the reinforcing resin material in the method for supplying the reinforcing resin material according to the fifteenth and sixteenth embodiments.
Figure 22A:
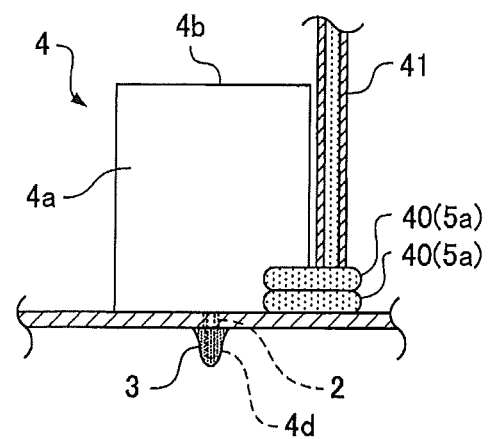
FIG. 22A is a front view showing a state during the application (supply) of the reinforcing resin material in the method for supplying the reinforcing resin material according to the fifteenth embodiment of the present invention.
Figure 22B:
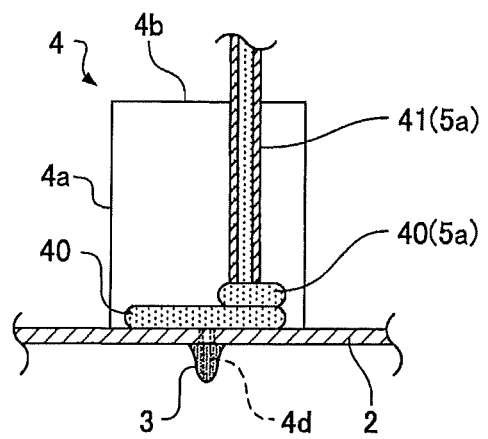
FIG. 22B is a side view showing a state during the application (supply) of the reinforcing resin material in the method for supplying the reinforcing resin material according to the fifteenth embodiment of the present invention.
Figure 23A:
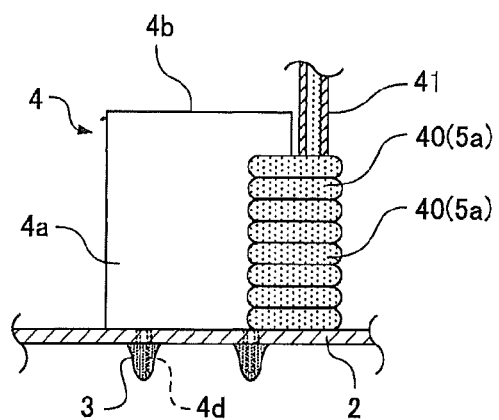
FIG. 23A is a front view showing a state immediately before the end of the application (supply) of the reinforcing resin material in the method for supplying the reinforcing resin material according to the fifteenth embodiment.
Figure 23B:
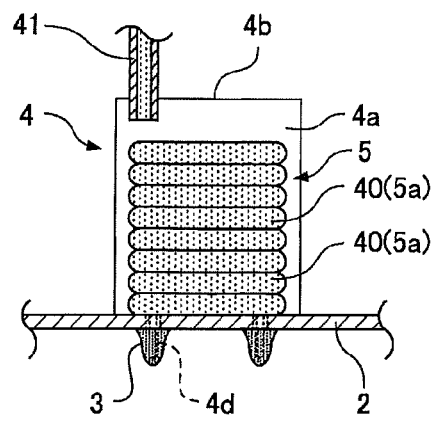
FIG. 23B is a side view showing a state at the completion of the application (supply) of the reinforcing resin material in the method for supplying the reinforcing resin material according to the fifteenth embodiment.
Figure 24A:
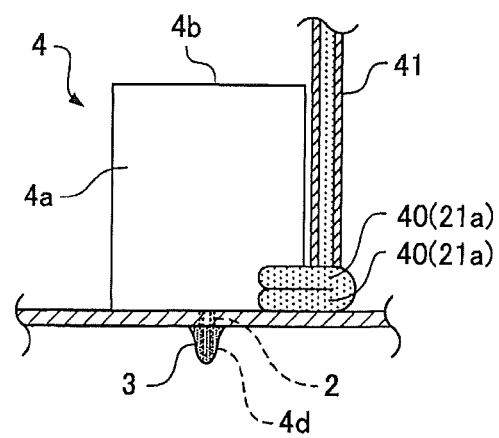
FIG. 24A is a front view showing a state during the application (supply) of the reinforcing resin material in the method for supplying the reinforcing resin material according to the sixteenth embodiment of the present invention.
Figure 24B:
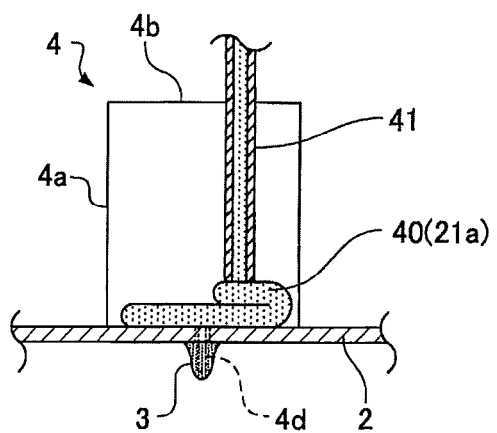
FIG. 24B is a side view showing a state during the application (supply) of the reinforcing resin material in the method for supplying the reinforcing resin material according to the sixteenth embodiment of the present invention.
Figure 25A:
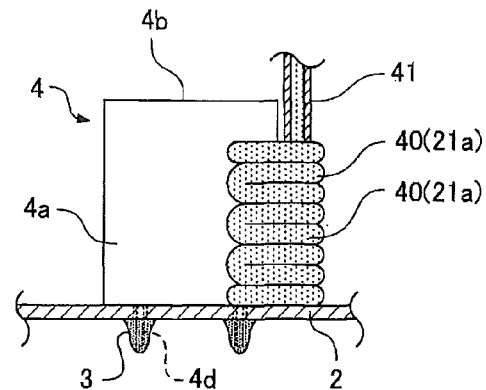
FIG. 25A is a front view showing a state immediately before the end of the application (supply) of the reinforcing resin material in the method for supplying the reinforcing resin material according to the sixteenth embodiment.
Figure 25B:
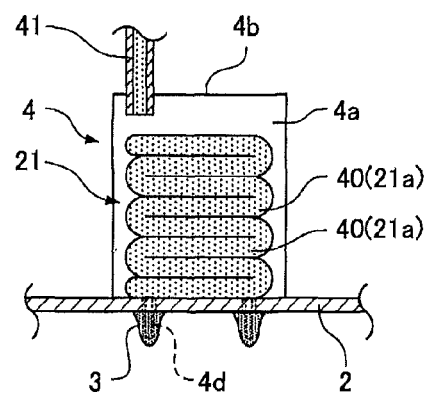
FIG. 25B is a side view showing a state at the completion of the application (supply) of the reinforcing resin material in the method for supplying the reinforcing resin material according to the sixteenth embodiment.

Since the reinforcing resin material 40 is applied by the supply nozzle 41 that is kept in an upright position and is not inclined, the holding position of the supply nozzle 41 only needs to be adjusted in two dimensions (X and Y directions). This can advantageously control the posture of a robot arm or the supply nozzle 41 with relative ease. Thus, for example, the positional relationship with the clearance L2 shown in FIG. 21A is kept by providing an image processor having a CCD camera or the like capable of recognizing the position of the electronic component, or recognizing the outside shape and position of the electronic component through three-dimensional shape recognition or laser recognition. Thus, the supply process can be automated with remarkably high operating efficiency with the supply nozzle 41 moved along the shape of the electronic component.

Figure 27A:
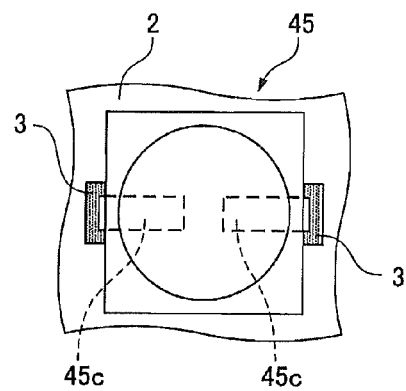
FIG. 27A is a plan view showing a substrate and a surface-mounted component serving as an electronic component used for a mounting structure according to a seventeenth embodiment of the present invention.
Figure 27B:
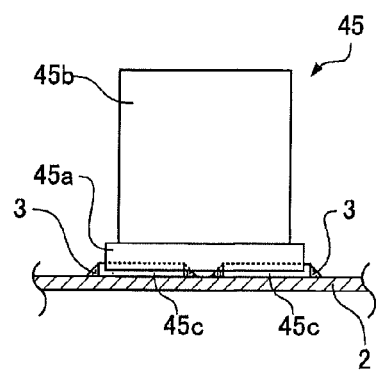
FIG. 27B is a front view showing the substrate and the surface-mounted component serving as an electronic component used for the mounting structure according to the seventeenth embodiment.
Figure 27C:
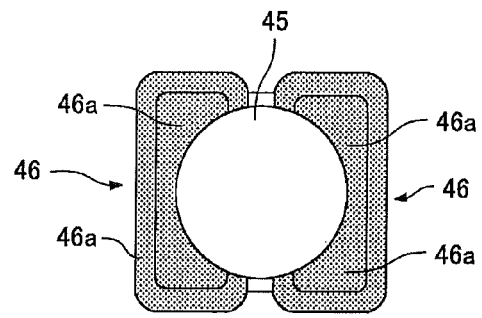
FIG. 27C is a plan view of the mounting structure according to the seventeenth embodiment.
Figure 27D:
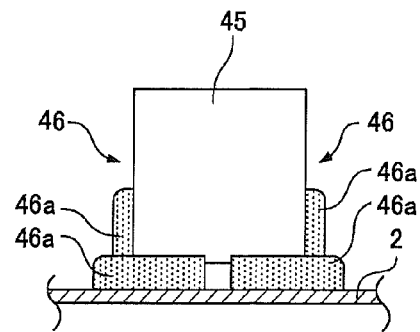
FIG. 27D is a front view of the mounting structure according to the seventeenth embodiment.
Figure 28:
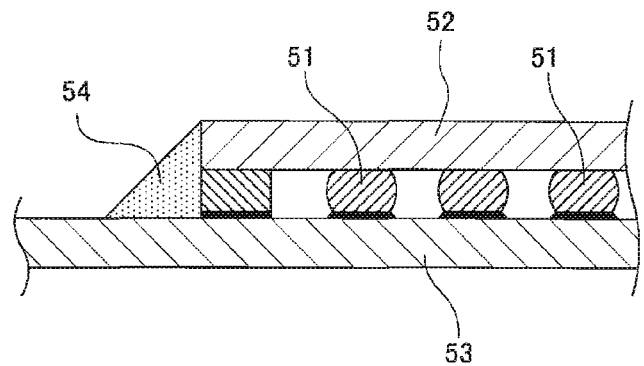
FIG. 28 is a cross-sectional view of a mounting structure reinforced by conventional reinforcing resin.
Figure 29:
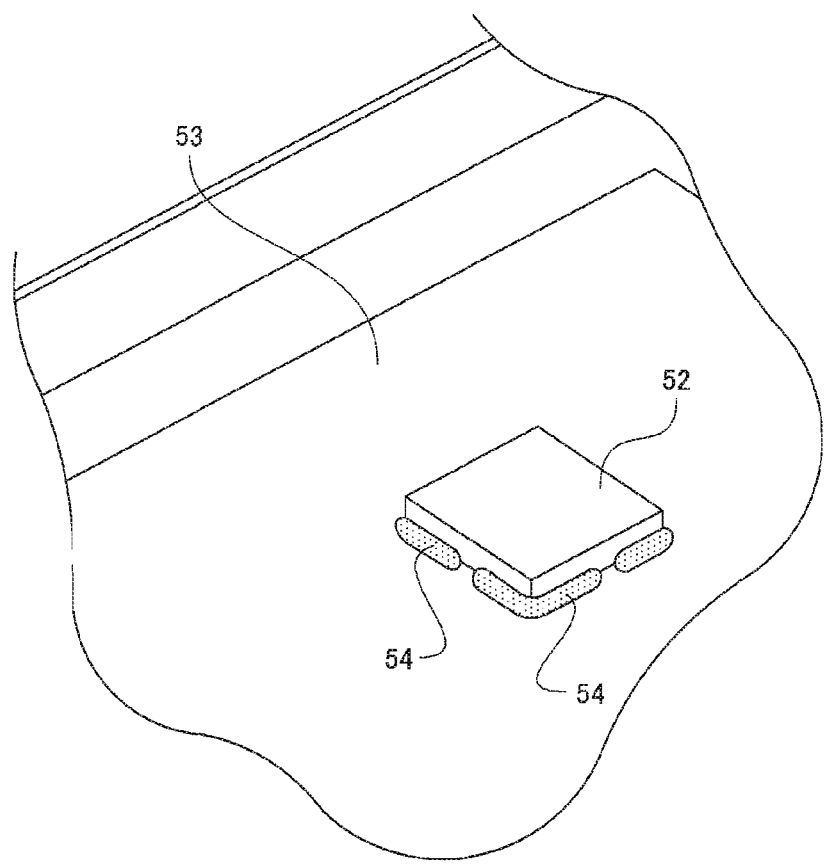
FIG. 29 is a plan view showing the mounting structure reinforced by the conventional reinforcing resin and a portion around the mounting structure.

In the foregoing embodiments, the electronic component is composed of an insertion electronic component (may be called an inserted component) that includes a connecting terminal inserted into the through hole of a substrate. The present invention is not limited to this configuration. For example, the present invention is applicable to a surface-mounted electronic component 45 shown in FIGS. 27A and 27B. In FIGS. 27A and 27B, reference numerals 45a and 45b denote the sides of the electronic component (surface-mounted component) 45, reference numeral 45c denotes the bottom electrode terminals of the electronic component (surface-mounted component) 45, reference numeral 2 denotes a substrate, and reference numeral 3 denotes the bonding metals of solder. Also in the case of the surface-mounted electronic component 45, a reinforcing resin body 46 having a similar configuration is applicable (Seventeenth Embodiment). Specifically, as shown in FIGS. 27C and 27D, the reinforcing resin body 46 may include a plurality of reinforcing resin layers 46a that are stacked along the sides 45a and 45b included in the electronic component 45 so as to be raised from the substrate 2 and are stacked in the height direction of the raised electronic component 45. The reinforcing resin body 46 configured thus can satisfactorily reinforce the electronic component 45.

The present invention is particularly suitable for a large electronic component raised so as to receive high acceleration that causes a large force between the electronic component and a substrate. The present invention is not limited to this configuration. The present invention is applicable to various mounting structures including relatively small electronic components having heavy weight.

What is claimed is:

1. A mounting structure comprising:
a substrate;
an electronic component mounted on the substrate with bonding metal; and
a reinforcing resin body bonded to the substrate and the electronic component,
wherein the reinforcing resin body includes a plurality of reinforcing resin layers along an outer periphery of the electronic component, and the reinforcing resin body extends only partially around the periphery of the electronic component,
the reinforcing resin body is configured such that the reinforcing resin layers are stacked in a height direction of the electronic component along a side of the electronic component, and
a bottom reinforcing resin layer in contact with the substrate separates the substrate from other reinforcing resin layers that are along the outer periphery of the electronic component.

2. The mounting structure according to claim 1, wherein each layer of the reinforcing resin body includes a plurality of resin components spaced from each other in a circumferential direction of the electronic component.

3. The mounting structure according to claim 1, wherein in the reinforcing resin body, the second reinforcing resin layer from a bottom in the height direction of the electronic component has at least a quarter of a volume of the bottom reinforcing resin layer in contact with the substrate.

4. The mounting structure according to claim 1, wherein the reinforcing resin layers adjacent to each other in the height direction of the electronic component have separated end faces.

5. The mounting structure according to claim 1, wherein the reinforcing resin layer has one end that is extended in a width direction of the side of the electronic component and then is folded toward the opposite side in the width direction so as to continue to one end of another reinforcing resin layer adjacent to the reinforcing resin layer in the height direction of the electronic component.

6. The mounting structure according to claim 1, wherein the reinforcing resin layers of the reinforcing resin body decrease in dimension in a width direction of the side of the electronic component as a height from the substrate increases.

7. The mounting structure according to claim 1, wherein the reinforcing resin layers of the reinforcing resin body decrease in thickness along the side of the electronic component as a height from the substrate increases.

8. The mounting structure according to claim 1, wherein the reinforcing resin body covers at least a part of a top surface of the electronic component.

9. The mounting structure according to claim 1, wherein the electronic component is an insertion electronic component that includes a connecting terminal inserted into a through hole formed on the substrate and is joined and mounted on a circuit of the substrate with the bonding metal.

10. A mounting structure comprising:
a substrate;
an electronic component mounted on the substrate with bonding metal; and
a reinforcing resin body bonded to the substrate and the electronic component,
wherein the reinforcing resin body includes a plurality of reinforcing resin layers along an outer periphery of the electronic component, and the reinforcing resin body extends only partially around the periphery of the electronic component,
the reinforcing resin body is configured such that the reinforcing resin layers are stacked in a height direction of the electronic component along a side of the electronic component, and
the electronic component has a square bottom and a cylindrical upper part, a first reinforcing resin layer extends partially around a periphery of the bottom of the electronic component, and a second reinforcing resin layer extends partially around a periphery of the upper part of the electronic component.

* * * * *